(12) United States Patent
Noda et al.

(10) Patent No.: US 11,581,485 B2
(45) Date of Patent: Feb. 14, 2023

(54) SEMICONDUCTOR MEMORY DEVICE AND METHOD FOR MANUFACTURING SEMICONDUCTOR MEMORY DEVICE

(71) Applicant: Kioxia Corporation, Tokyo (JP)

(72) Inventors: Kotaro Noda, Yokkaichi Mie (JP); Kyoko Noda, Yokkaichi Mie (JP); Ken Hoshino, Yokkaichi Mie (JP); Shuichi Tsubata, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/461,029

(22) Filed: Aug. 30, 2021

(65) Prior Publication Data

US 2022/0302378 A1 Sep. 22, 2022

(30) Foreign Application Priority Data

Mar. 18, 2021 (JP) .............................. JP2021-044482

(51) Int. Cl.
*H01L 45/00* (2006.01)
*H01L 23/528* (2006.01)
*H01L 27/24* (2006.01)

(52) U.S. Cl.
CPC .......... *H01L 45/06* (2013.01); *H01L 23/5283* (2013.01); *H01L 27/2481* (2013.01); *H01L 45/16* (2013.01)

(58) Field of Classification Search
CPC ................................ H01L 45/06; H01L 45/16
See application file for complete search history.

(56) References Cited

U.S. PATENT DOCUMENTS

2011/0037046 A1    2/2011    Sato et al.

FOREIGN PATENT DOCUMENTS

JP            2011-040579 A        2/2011

OTHER PUBLICATIONS

Kyodo International Inc., "Sputtered insulation layers equivalent to CVD", Downloaded May 14, 2021, 4 pages URL:https://www.kyodo-inc.co.jp/electronics/wafer-process/data/thinfilm-insulator.html.

*Primary Examiner* — Marvin Payen
(74) *Attorney, Agent, or Firm* — Foley & Lardner LLP

(57) ABSTRACT

A semiconductor memory device includes a first interconnect, a second interconnect, a first storage layer, and a first insulating film. The first insulating film is provided along a surface of a part of the second interconnect and a surface of the first storage layer. The first insulating film is composed of Si, N, and O. The atomic ratio (N/O) between N and O in the first insulating film is not less than 1.0 at a first position which is the position of the second interconnect-side end surface of the first storage layer in a third direction. The atomic ratio (N/O) between N and O in the first insulating film is less than 1.0 at a second position which is the position of the end surface of the second interconnect, opposite to the first storage layer-side end surface, in the third direction.

19 Claims, 19 Drawing Sheets

FIG. 6
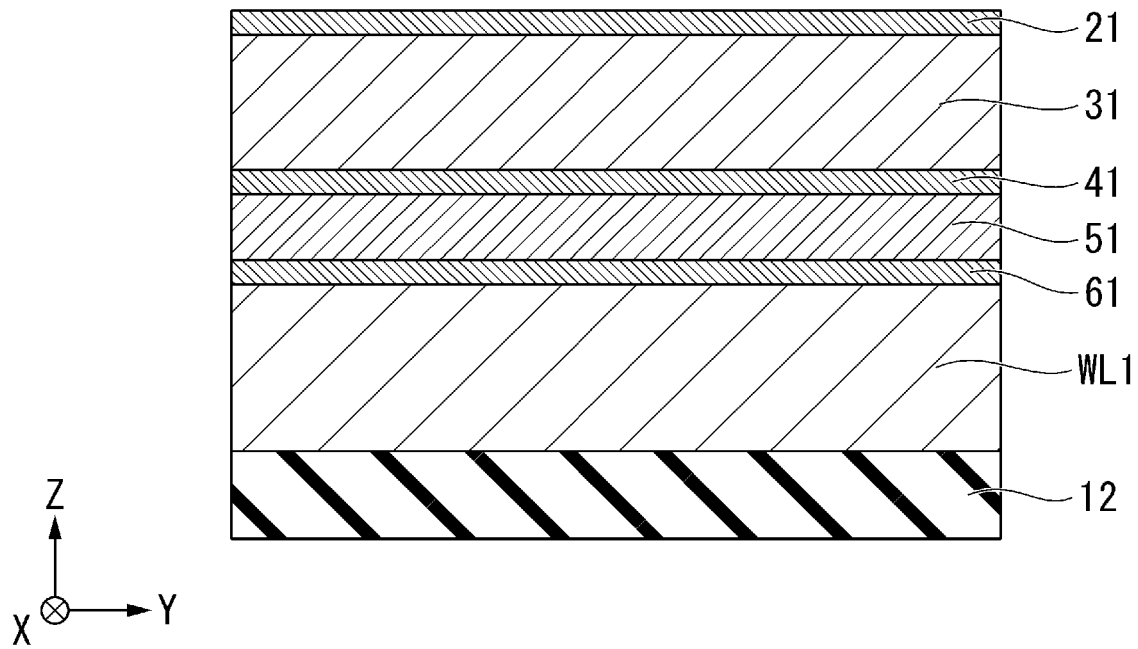
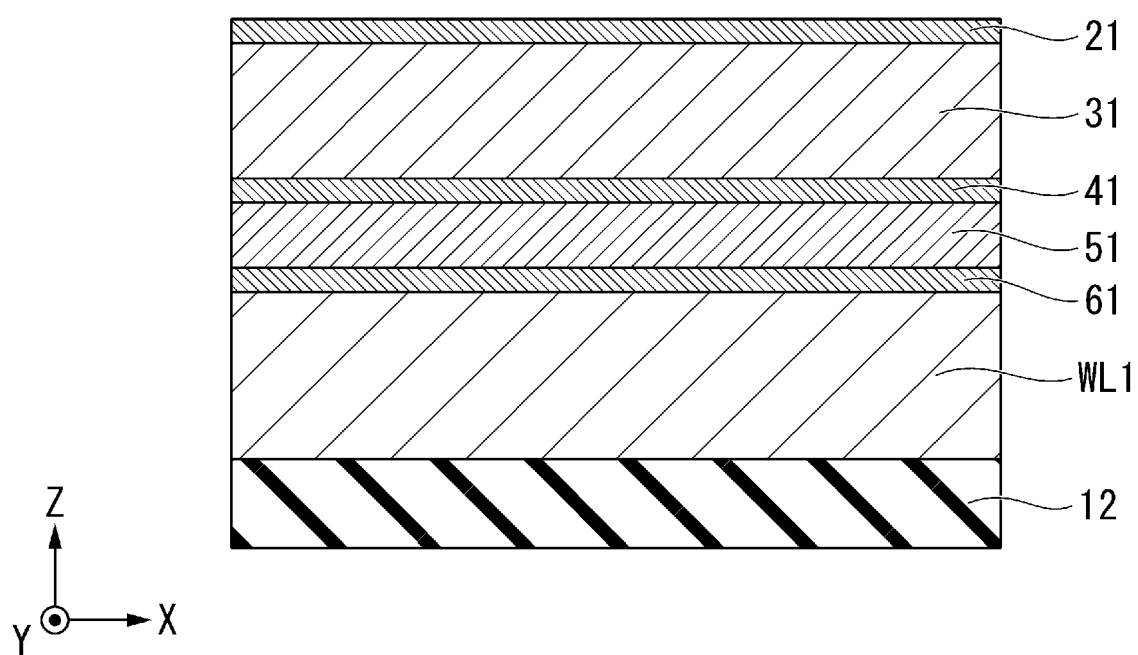

FIG. 7
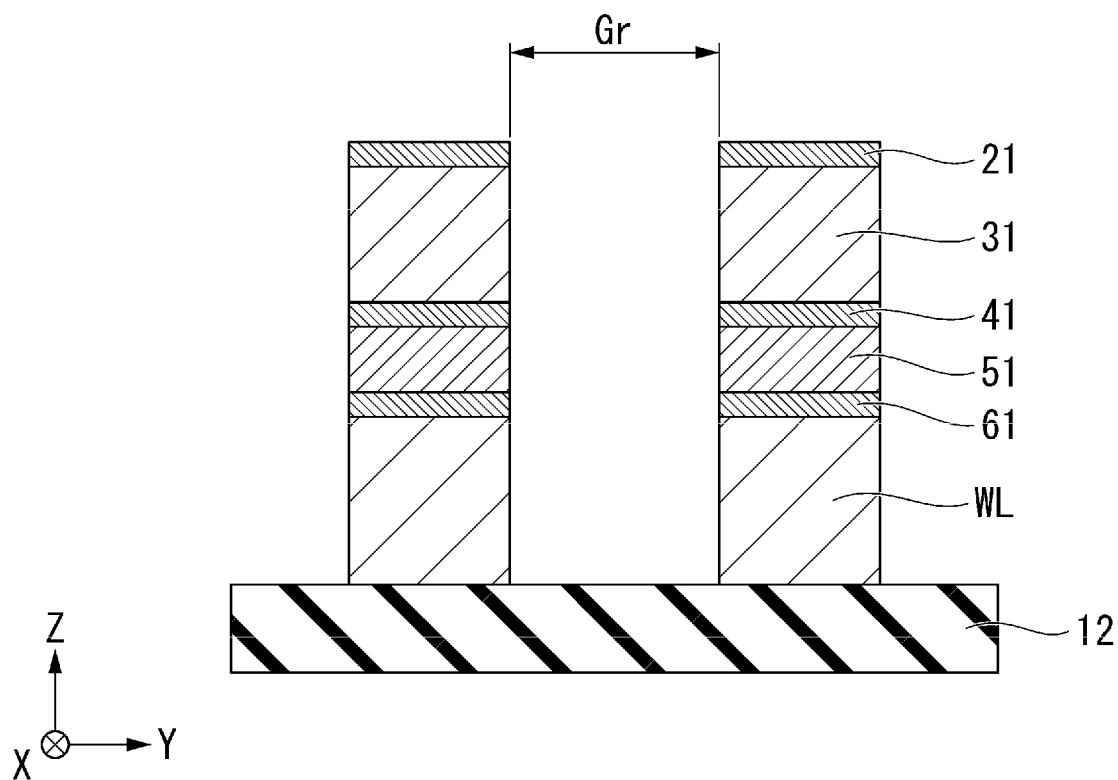
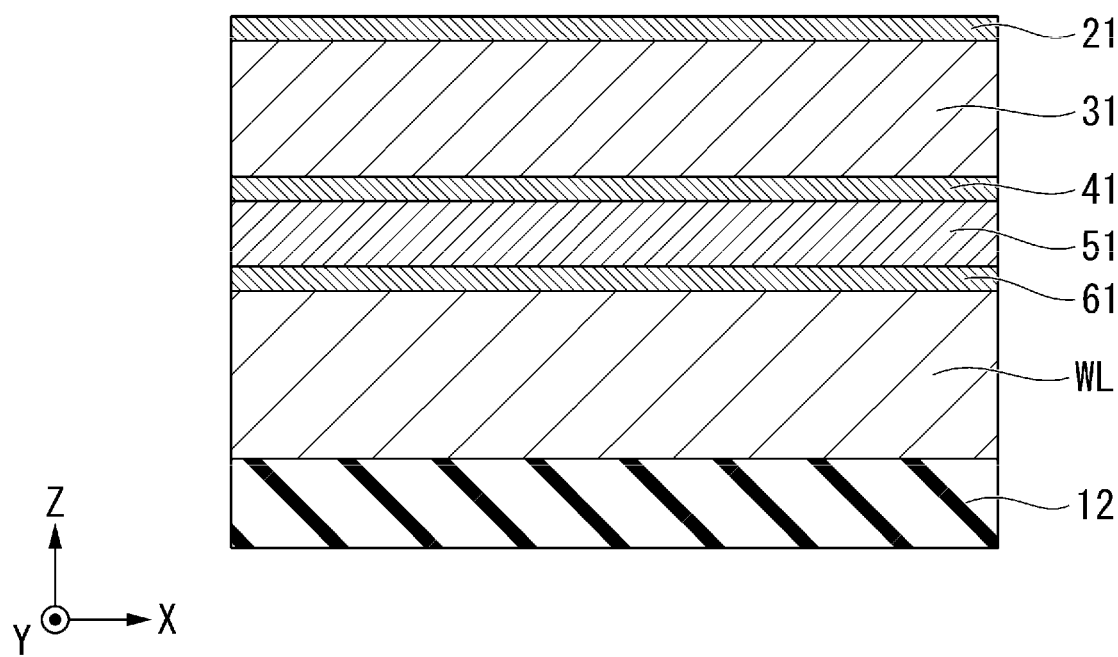

FIG. 8
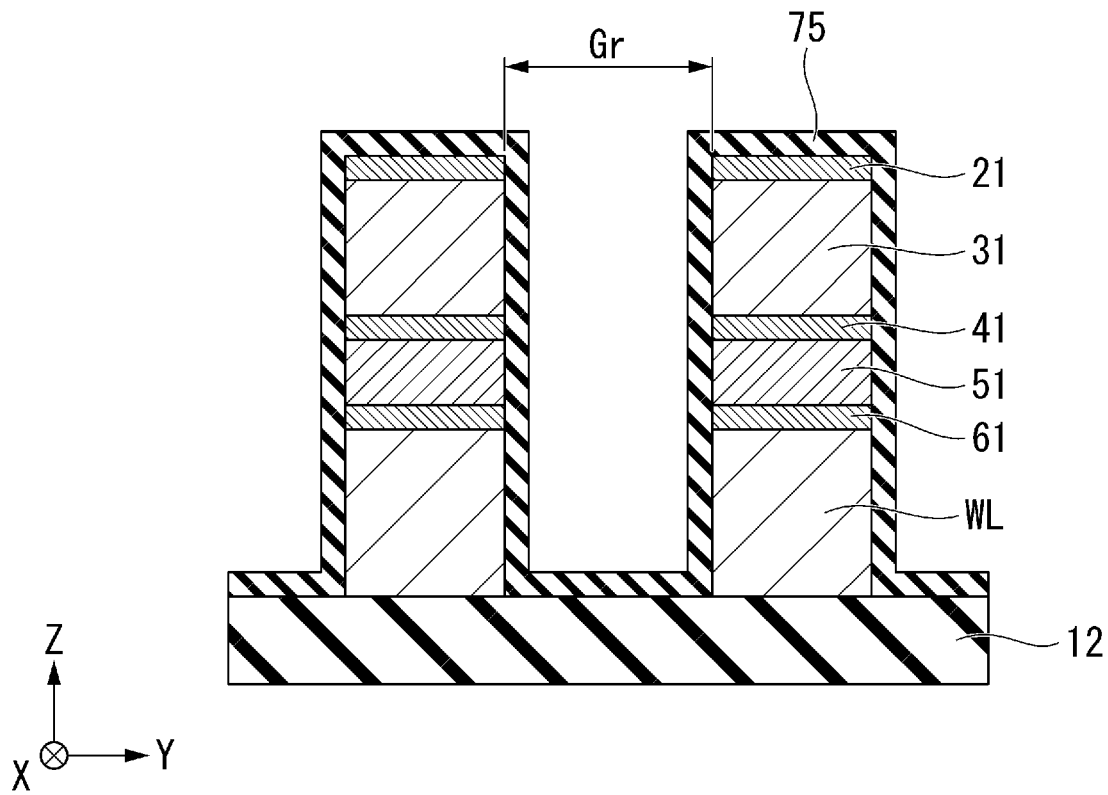
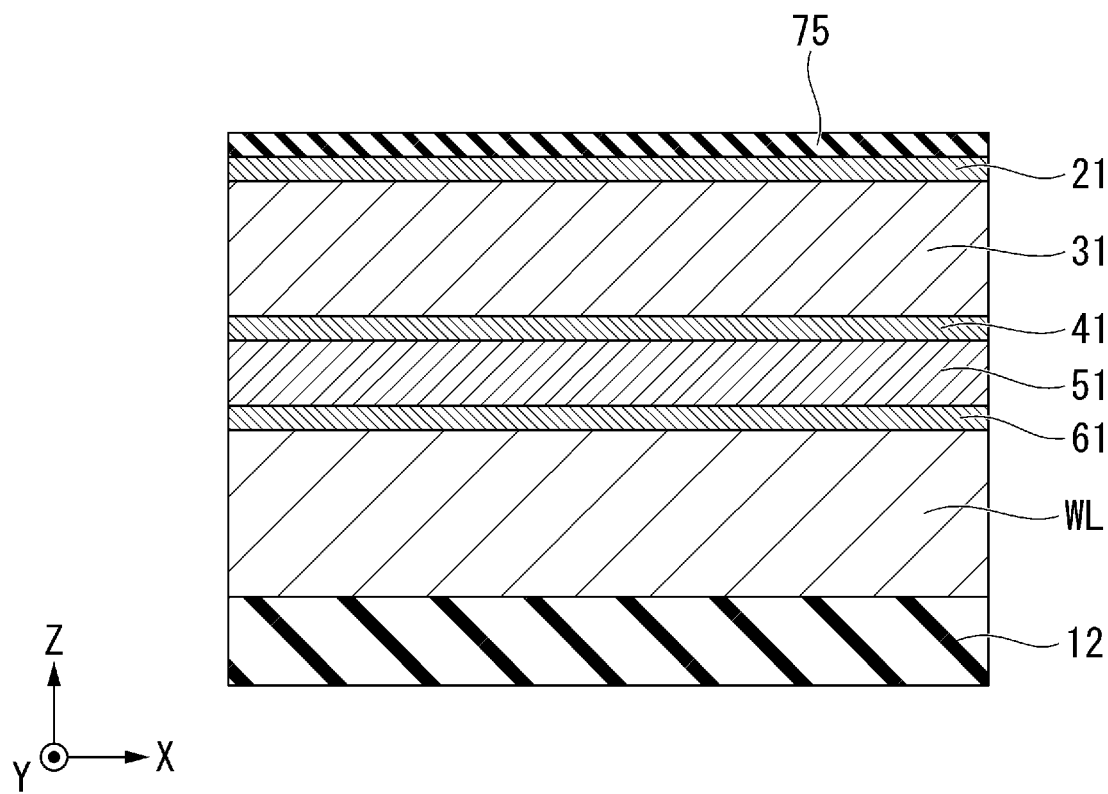

FIG. 9
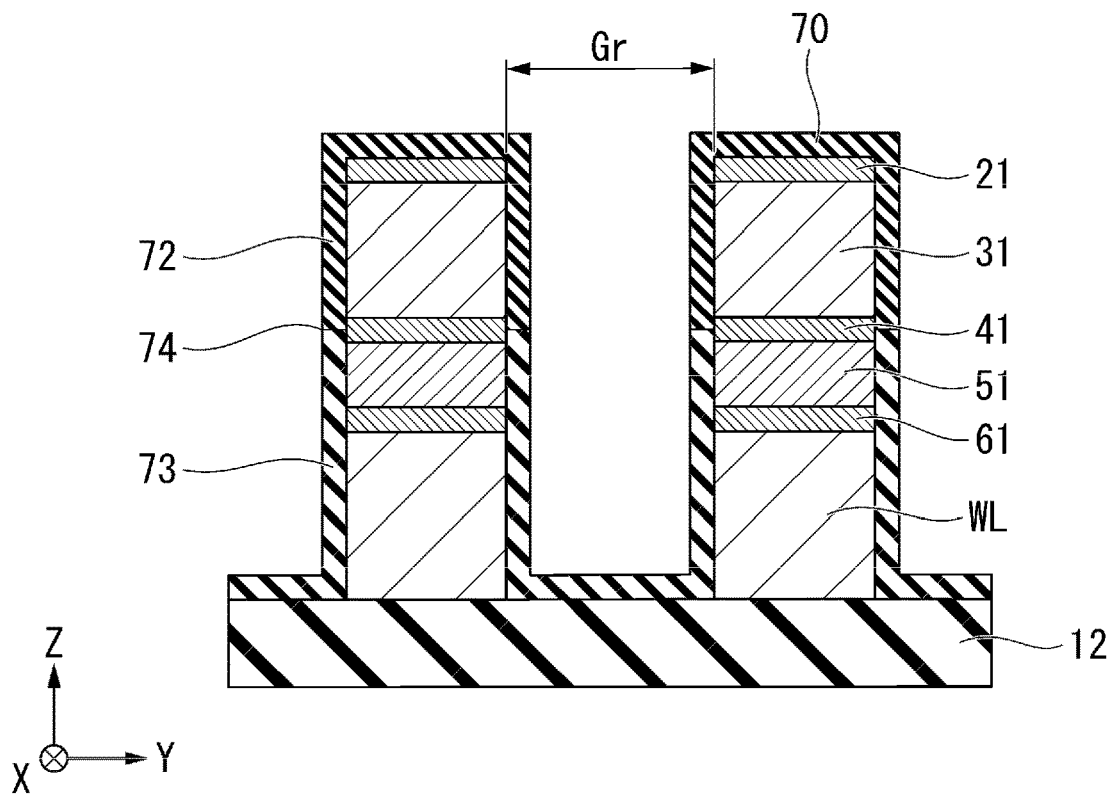
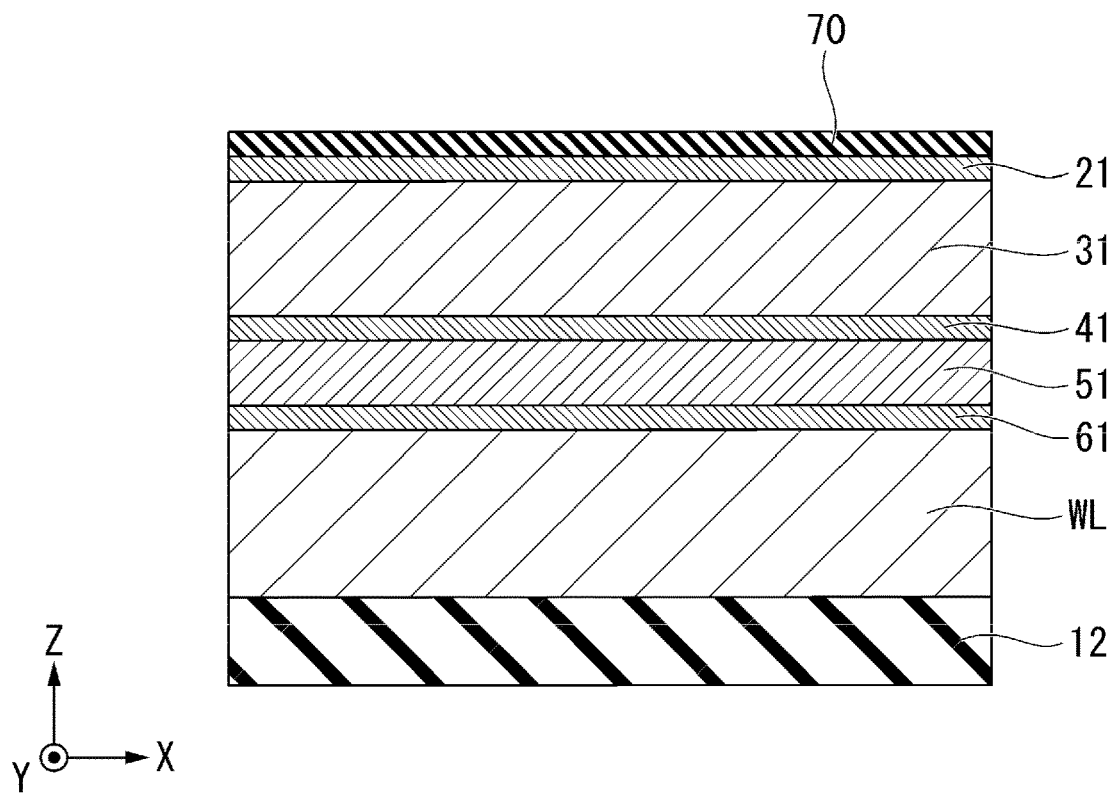

FIG. 10
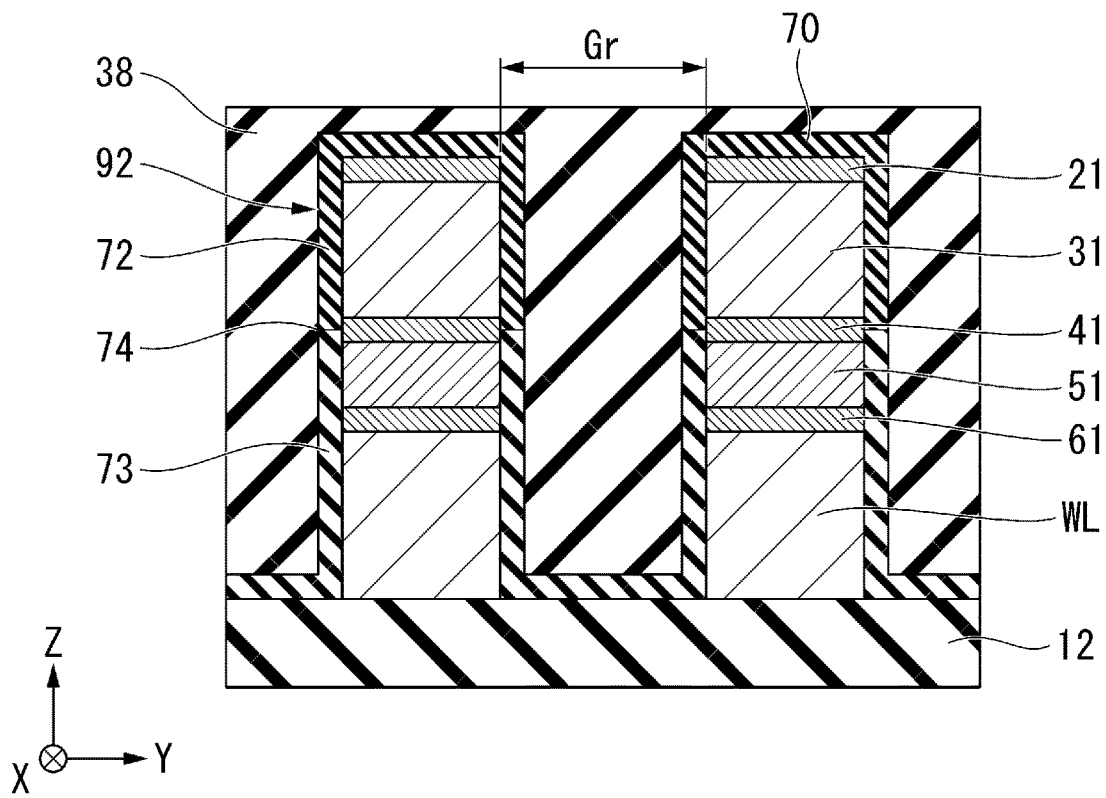
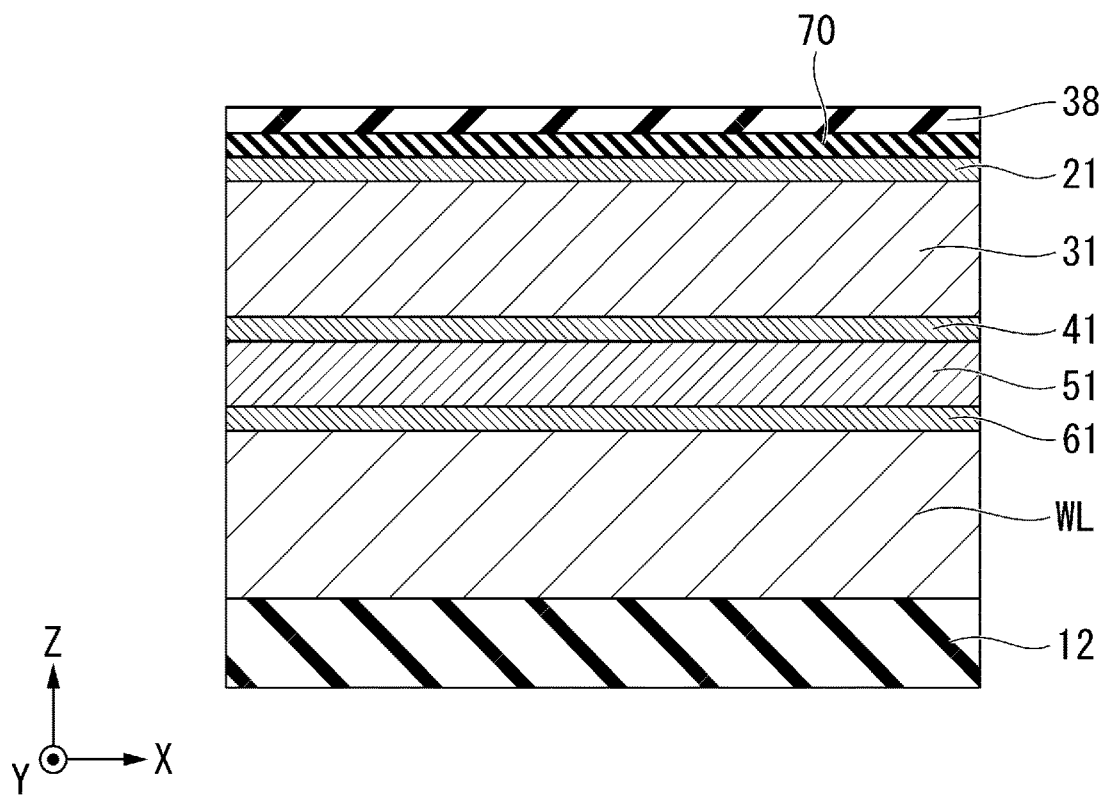

FIG. 11
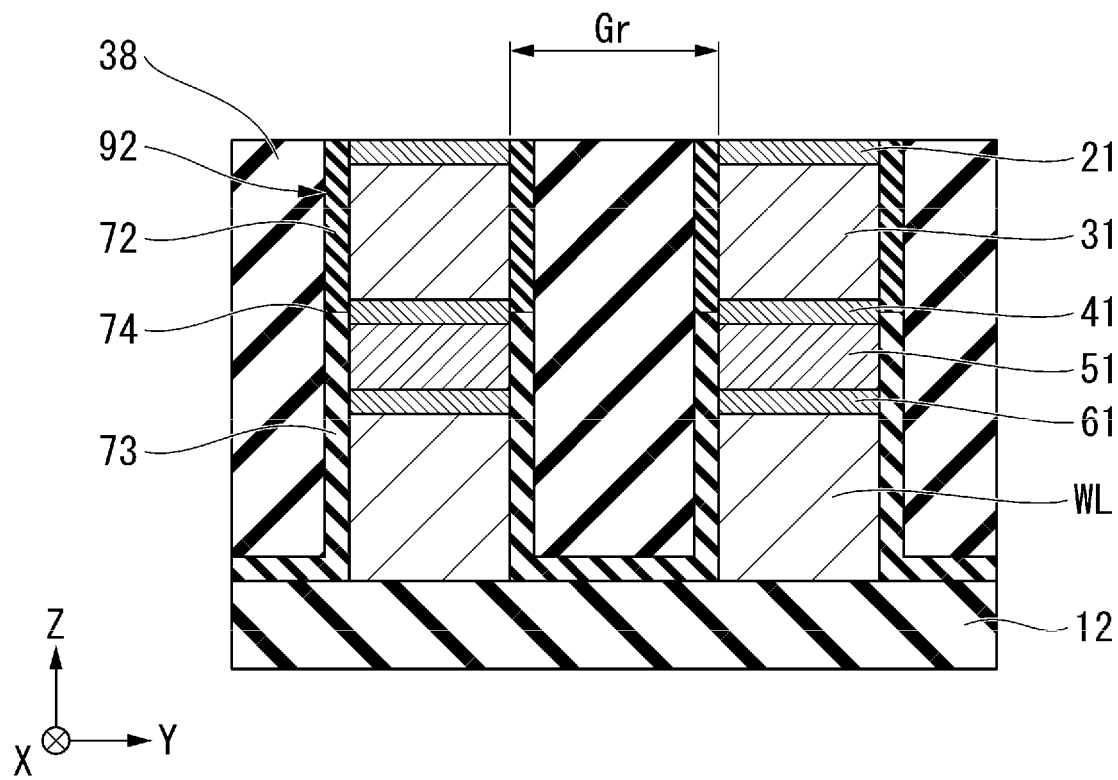
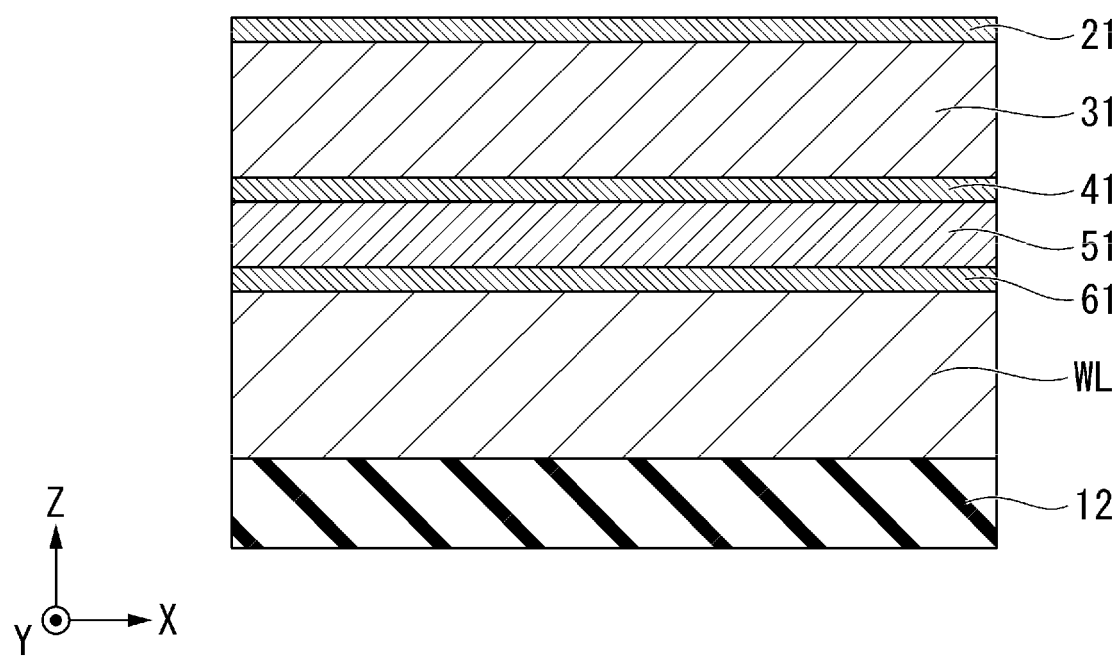

FIG. 12
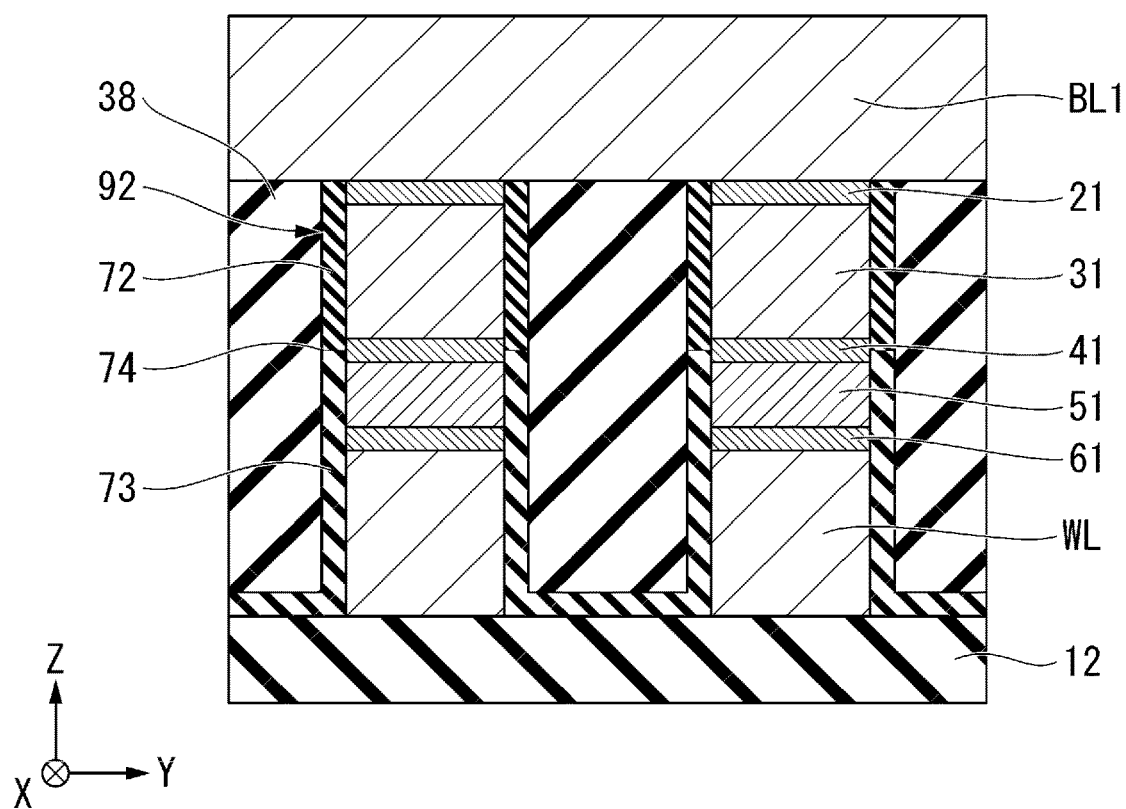
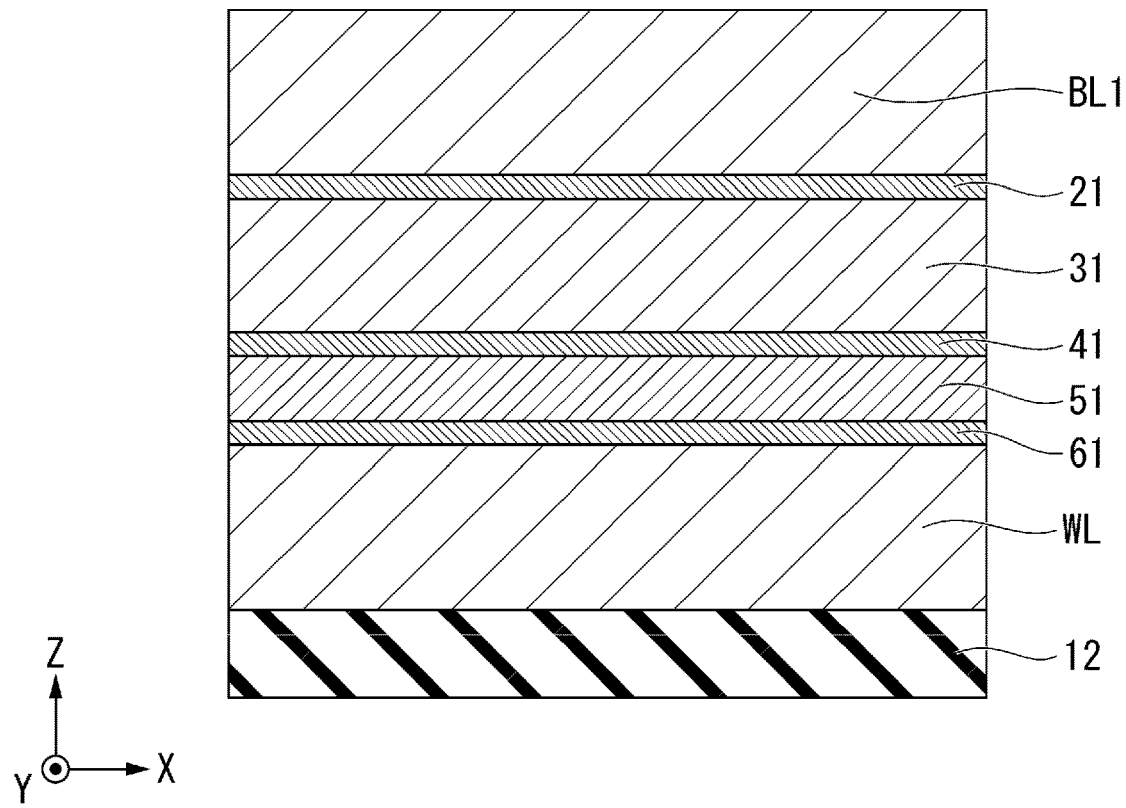

SEMICONDUCTOR MEMORY DEVICE AND METHOD FOR MANUFACTURING SEMICONDUCTOR MEMORY DEVICE

CROSS-REFERENCE TO RELATED APPLICATION(S)

This application is based upon and claims the benefit of priority from Japanese Patent Application No. 2021-044482, filed Mar. 18, 2021, the entire contents of which are incorporated herein by reference.

FIELD

Embodiments described herein relate generally to a semiconductor memory device and a method for manufacturing a semiconductor memory device.

BACKGROUND

A semiconductor memory device having a cross-point structure using a phase-change memory (PCM) is known.

DESCRIPTION OF THE DRAWINGS

FIG. 6 shows cross-sectional views illustrating an example step for manufacturing memory cells according to the first embodiment.

FIG. 7 shows cross-sectional views illustrating an example step for manufacturing the memory cells according to the first embodiment.

FIG. 8 shows cross-sectional views illustrating an example step for manufacturing the memory cells according to the first embodiment.

FIG. 9 shows cross-sectional views illustrating an example step for manufacturing the memory cells according to the first embodiment.

FIG. 10 shows cross-sectional views illustrating an example step for manufacturing the memory cells according to the first embodiment.

FIG. 11 shows cross-sectional views illustrating an example step for manufacturing the memory cells according to the first embodiment.

FIG. 12 shows cross-sectional views illustrating an example step for manufacturing the memory cells according to the first embodiment.

DETAILED DESCRIPTION

Figure 1:
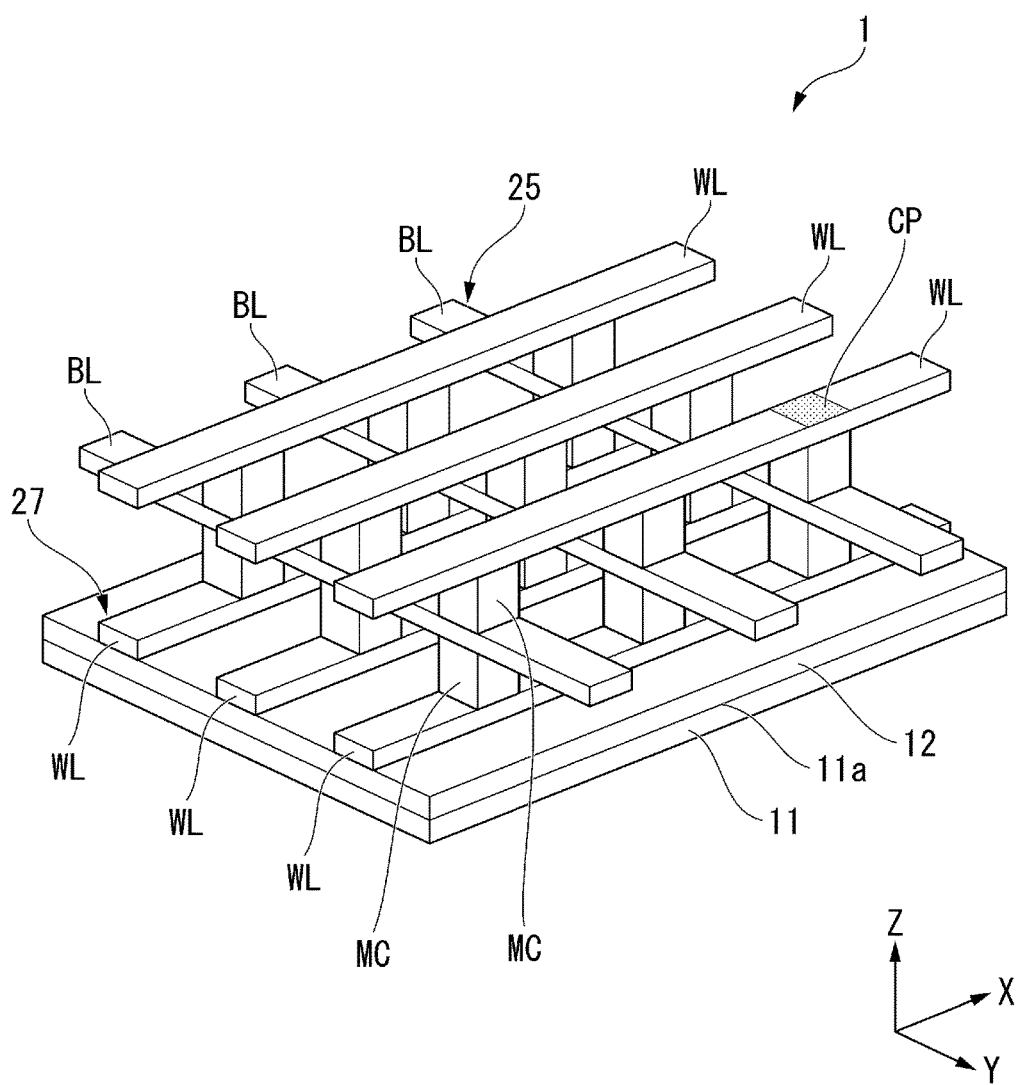
FIG. 1 is a schematic perspective view of a semiconductor memory device according to a first embodiment.

At least one embodiment provides a semiconductor memory device having enhanced electrical properties, and a method for manufacturing the semiconductor memory device.

In general, according to at least one embodiment, a semiconductor memory device comprises a first interconnect, a second interconnect, a first storage layer, and a first insulating film. The first interconnect extends in a first direction. The second interconnect extends in a second direction intersecting the first direction, and provided at a different position from the first interconnect in a third direction intersecting the first direction and the second direction. The first storage layer is provided between the first interconnect and the second interconnect in the third direction. The first insulating film is provided along a surface of a part of the second interconnect and a surface of the first storage layer. The first insulating film is composed of Si, N, and O. The atomic ratio (N/O) between N and O in the first insulating film is not less than 1.0 at a first position which is the position of the second interconnect-side end surface of the first storage layer in the third direction. The atomic ratio (N/O) between N and O in the first insulating film is less than 1.0 at a second position which is the position of the end surface of the second interconnect, opposite to the first storage layer-side end surface, in the third direction.

Embodiments of the present disclosure will now be described with reference to the drawings. In the drawings and the description below, same symbols are used for components or elements having the same or similar functions, and a duplicate description thereof may be omitted. As used herein, such terms as "parallel", "perpendicular", "same", and "equal" include "approximately parallel", "approximately perpendicular", "approximately same", and "approximately equal", respectively.

As used herein, the term "connection" is not limited to physical connection, and includes electrical connection. Thus, "connection" is not limited to direct connection between two members, and includes a case where another member intervenes between the two members. As used herein, the term "contact" refers to direct contact. As used herein, such terms as "overlap", "face" and "adjacent" are not limited to a case where two members directly face each other, or are in contact with each other, and include a case where another member lies between the two members. The phrase "on XX" includes a case where an object is above and not in contact with XX.

First Embodiment

The construction of a semiconductor memory device 1 according to a first embodiment will now be described with reference to the drawings. FIG. 1 is a schematic perspective view of the semiconductor memory device 1. X direction (second direction) herein refers to a direction parallel to a surface 11a of a silicon substrate 11 and in which word lines WL extend. Y direction (first direction) refers to a direction parallel to the surface 11a of the silicon substrate 11 and intersecting the X direction, and in which bit lines BL extend. For example, the Y direction is approximately perpendicular to the X direction. Z direction (third direction) refers to the thickness direction of the silicon substrate 11 and intersects the X direction and the Y direction. For example, the Z direction is approximately perpendicular to the X direction and the Y direction. Such a phrase as "downward in the Z direction" refers to a direction toward the silicon substrate 11 along the Z direction, and such a phrase as "upward in the Z direction" refers to the opposite direction, i.e. a direction away from the silicon substrate 11 along the Z direction. It is to be noted that such terms as "upward", "above", "downward" and "below", as used herein, are for purposes of explanatory convenience, and do not relate to the direction of gravitational force.

(Semiconductor Memory Device 1)

The semiconductor memory device 1 is a so-called cross-point type semiconductor memory device using a phase-change memory (PCM). The semiconductor memory device 1 includes, for example, a silicon substrate 11, an interlayer insulating layer 12, a plurality of word lines WL, a plurality of bit lines BL, and a plurality of memory cells MC.

A drive circuit (not shown) for driving the semiconductor memory device 1 is formed on the surface 11a of the silicon substrate 11. The interlayer insulating layer 12 is formed on the surface 11a of the silicon substrate 11 and covers the drive circuit. The interlayer insulating layer 12 is formed of, for example, silicon oxide ($SiO_2$).

The bit lines BL each have a strip-like shape along the Y direction and extend in the Y direction (first direction). The bit lines BL are arranged at intervals in the X direction (second direction) and in the Z direction (third direction). The bit lines BL are provided at different positions from the word lines WL in the Z direction intersecting the X direction and the Y direction. Bit lines BL arranged in the X direction lie at the same position in the Z direction and constitute one bit-line layer 25. The bit lines BL are formed of, for example, tungsten (W). The bit lines BL are an example of "first interconnects".

The word lines WL each have a strip-like shape along the X direction and extend in the X direction. The word lines WL are arranged at intervals in the Y direction and in the Z direction. In particular, word lines WL arranged in the Y direction lie at the same position in the Z direction and constitute one word-line layer 27. Thus, the word lines (second interconnects) WL extend in the second direction intersecting the first direction, and are provided at different positions from the bit lines (first interconnects) BL in the third direction intersecting the first direction and the second direction. The word-line layers 27 are arranged at intervals in the Z direction. The word lines WL are formed of, for example, tungsten (W). The word lines WL are an example of "second interconnects". Alternatively, the bit lines BL may be an example of "second interconnects", and the word lines WL may be an example of "first interconnects". A word line WL, which is located adjacent to a word line as a second interconnect in the Y direction, is an example of a "third interconnect".

Each bit-line layer 25 is provided between two word-line layers 27, which are adjacent to each other in the Z direction, and is located at a distance from each of the two word-line layers 27 in the Z direction. The word-line layers 27 and the bit-line layers 25 are disposed alternately in the Z direction.

The Y-direction width of each word line WL and the X-direction width of each bit line BL are equal to a minimum feature size F. An interlayer insulating film 38 (see FIG. 3) intervenes between every adjacent word lines WL in each word-line layer 27 and between every adjacent bit lines BL in each bit-line layer 25.

The word lines WL and the bit lines BL intersect each other when viewed in the Z direction. For example, the word lines WL and the bit lines BL perpendicularly intersect each other when viewed in the Z direction. When viewed in the Z direction, a memory cell MC is provided in an overlapping area CP where a word line WL and a bit line BL overlap. The memory cell MC is located between the word line WL and the bit line BL in the overlapping area CP. The memory cells MC, provided in the overlapping areas CP, are arranged in a three-dimensional matrix pattern at intervals in the X direction, in the Y direction and in the Z direction.

Figure 2:
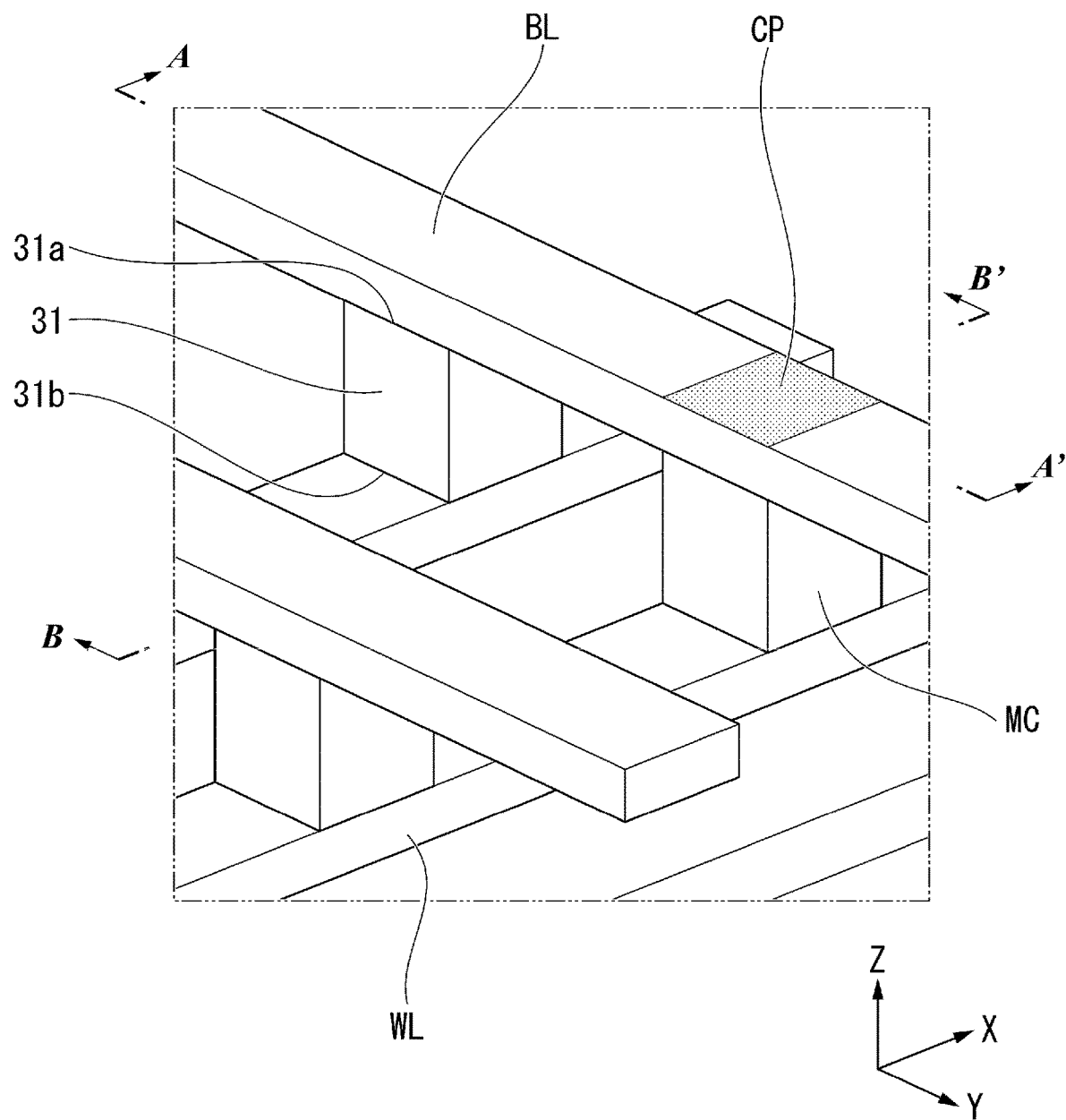
FIG. 2 is a perspective view of memory cells according to the first embodiment.

FIG. 2 is a perspective view of the memory cells MC. As shown in FIG. 2, each memory cell MC is comprised of a pillar 31 having an approximately prismatic shape with the Z direction as the longitudinal direction. One end surface 31a of the pillar 31 is in contact with a bit line BL over the entire overlapping area CP. The other end surface 31b of the pillar 31 is in contact with a word line WL over the entire overlapping area CP. An interlayer insulating film 38 (see FIG. 3) is provided between memory cells MC which are adjacent to each other in the X and Y directions. The below-described liner film 70 (see FIG. 3) covers the circumference of each memory cell MC, a part of the word line WL, and a part of the bit line BL.

Figure 3:
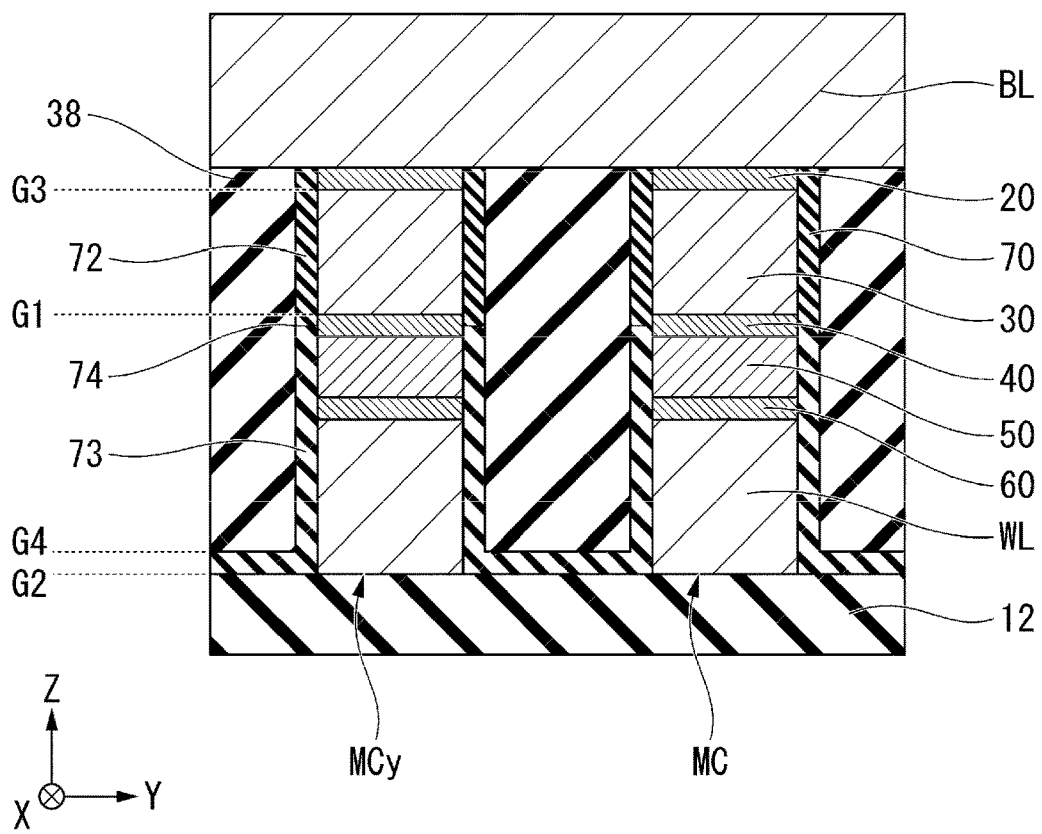
FIG. 3 is a cross-sectional view of the memory cells on the line A-A' of FIG. 2.
Figure 4:
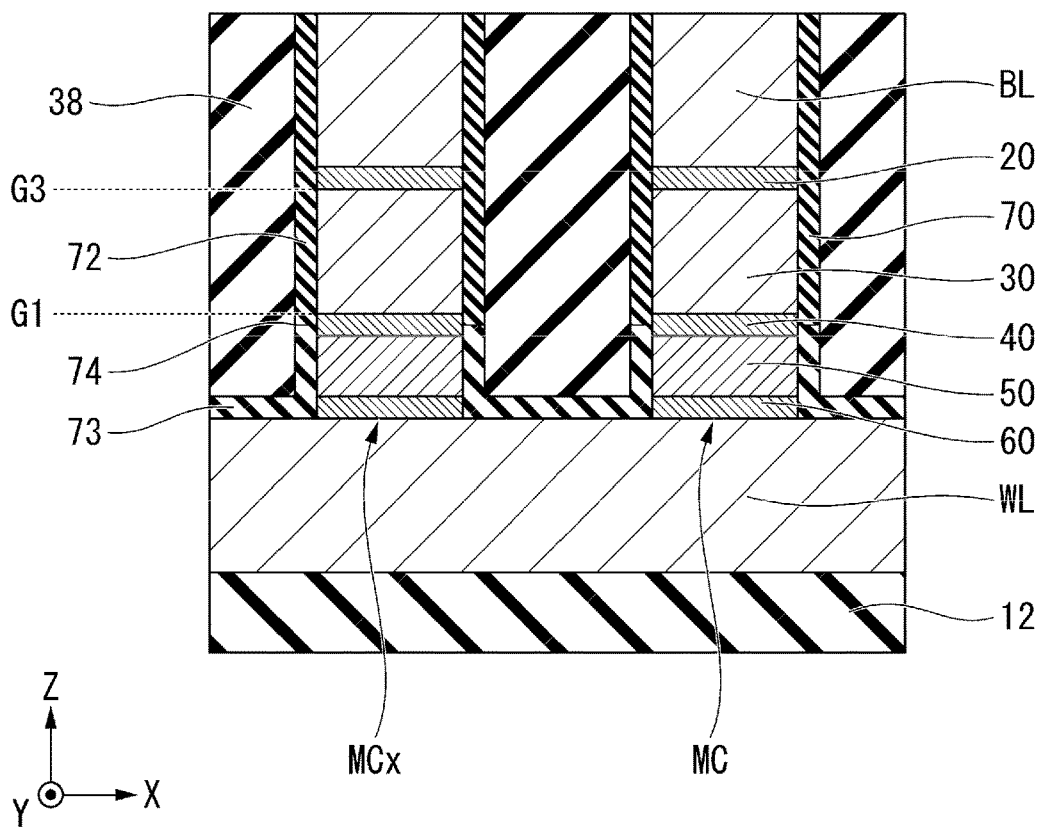
FIG. 4 is a cross-sectional view of the memory cells on the line B-B' of FIG. 2.

The memory cells MC will now be described with reference to FIGS. 3 and 4. FIG. 3 is a cross-sectional view of the memory cells MC on the line A-A' of FIG. 2. FIG. 4 is a cross-sectional view of the memory cells MC on the line B-B' of FIG. 2. The memory cells MC each include, for example, a first conductive layer 20, a storage layer 30, a second conductive layer 40, a selector layer 50, and a third conductive layer 60. Each memory cell MC is covered with a liner film 70, and an interlayer insulating film 38 is provided between adjacent memory cells MC. A memory cell is now referred to as a first memory cell MC, a memory cell which is adjacent to the first memory cell MC via the interlayer insulating film 38 in the Y direction is referred to as a second memory cell MCy, and a memory cell which is adjacent to the first memory cell MC via the interlayer insulating film 38 in the X direction is referred to as a third memory cell MCx.

The interlayer insulating film 38 is provided between the liner film 70 covering the first memory cell MC and the liner film 70 covering the second memory cell MCy in the Y direction. Further, the interlayer insulating film 38 is provided between the liner film 70 covering the first memory cell MC and the liner film 70 covering the third memory cell MCx in the X direction. The interlayer insulating film 38 is thicker than the liner film 70 in the Y-direction width and in the X-direction width. The sum of the Y-direction width of the liner film 70 covering the first memory cell MC, the Y-direction width of the interlayer insulating film 38, and the Y-direction width of the liner film 70 covering the second memory cell MCy, between the first memory cell MC and the second memory cell MCy, is equal to the Y-direction width of the first memory cell MC. The interlayer insulating film 38 is provided in the Z direction between the position of the surface of the liner film 70 in contact with the interlayer insulating layer 12 or the position of the surface of the liner film 70 in contact with the upper surface of the word line WL and the position of the upper surface (opposite to the first conductive layer 20-side surface) of the bit line BL. The liner film 70 lies between the interlayer insulating film 38 and the interlayer insulating layer 12.

The first conductive layer 20 is provided between the word line WL and the bit line BL in the Z direction. The first conductive layer 20 lies between the storage layer 30 and the bit line BL in the Z direction. The first conductive layer 20 functions as an electrode for the storage layer 30. The first conductive layer 20 also functions to prevent alloying of the storage layer 30 and the bit line BL. The first conductive layer 20 may be made of, for example, carbon (C), carbon nitride (CN) or the like, tungsten (W) or the like, polycrystalline silicon doped with an N-type impurity such as phosphorus (P), or the like, or other conductive material such as tungsten carbide (WC), tungsten carbonitride (WCN), or tungsten carbonitride silicide (WCNSi). The Z-direction thickness (e.g., the maximum thickness) of the first conductive layer 20 is, for example, smaller than the Z-direction thickness (e.g., the maximum thickness) of the storage layer 30.

The storage layer 30 stores information e.g. through a change in the state of the material of the storage layer 30. The storage layer 30 is formed of, for example, a PCM. When the storage layer 30 is formed of a PCM, it may be formed of, for example, a chalcogenide alloy, called GST, composed of germanium (Ge), antimony (Sb), and tellurium (Te). The compositional ratio between Ge, Sb and Te is, for example, 2:2:5. The storage layer 30 becomes a crystalline state which is a low-resistance state when the storage layer 30 is heated at a temperature which is lower than the melting temperature and higher than the crystallization temperature, followed by mild cooling. The storage layer 30 becomes an amorphous state which is a high-resistance state when the storage layer 30 is heated at a temperature which is higher than the melting temperature, followed by rapid cooling. The Z-direction thickness (e.g., the maximum thickness) of the storage layer 30 is, for example, larger than the thickness (e.g., the maximum thickness) of the selector layer 50, and is, for example, smaller than the thickness of the Z-direction thickness of the word line WL. The storage layer 30 in the first memory cell MC is an example of a "first storage layer". The storage layer 30 in the second memory cell MCy is an example of a "third storage layer".

In particular, when the voltage applied to the storage layer 30 reaches a predetermined value, the carrier in the storage layer 30 is multiplied, and the resistance of the storage layer 30 decreases rapidly. When a voltage higher than the predetermined value is applied to the storage layer 30, a high current flows and Joule heat is generated. Therefore the temperature of the storage layer 30 increases. When the applied voltage is controlled and the temperature of the storage layer 30 is held in the crystallization temperature range, the storage layer 30 transitions to a polycrystalline state, and the resistance of the storage layer 30 decreases. The polycrystalline state is maintained even when the applied voltage becomes zero, and the resistance of the storage layer 30 remains low. When a high voltage is applied to the storage layer 30 in the low-resistance state to allow a high current to flow and to increase the temperature of the storage layer 30 above the melting point of the chalcogenide alloy, the chalcogenide alloy of the storage layer 30 melts. When the applied voltage decreases rapidly, the storage layer 30 is cooled rapidly, while the resistance of the storage layer 30 remains high.

The storage layer 30 is a layer that maintains the above-described low-resistance state or high-resistance state. The storage layer 30 can take at least two different resistance values as bistable states at room temperatures by applying a voltage or supplying a current thereto. By writing and reading the two stable resistance values, at least binary memory operations can be performed. When the storage layer 30 is allowed to perform a binary memory operation, the set state of the storage layer 30 is made to correspond to e.g. "1", and the reset state is made to correspond to e.g. "0".

The second conductive layer 40 is provide between the storage layer 30 and the selector layer 50. The second conductive layer 40 functions to prevent alloying of the storage layer 30 and the selector layer 50 and to electrically connect the storage layer 30 and the selector layer 50. The second conductive layer 40 may be made of, for example, carbon (C), carbon nitride (CN) or the like, tungsten (W) or the like, polycrystalline silicon doped with an N-type impurity such as phosphorus (P), or the like, or other conductive material such as tungsten carbide (WC), tungsten carbonitride (WCN), or tungsten carbonitride silicide (WCNSi). The Z-direction thickness (e.g., the maximum thickness) of the second conductive layer 40 is, for example, smaller than the Z-direction thickness (e.g., the maximum thickness) of the storage layer 30.

The selector layer 50 is a film that functions as a selection element of the memory cell MC. The selector layer 50 is provided between the storage layer 30 and the word line (second interconnect) WL. The selector layer 50 may be, for example, a switching element between two terminals. When a voltage applied between the two terminals is lower than a threshold value, the switching element is in a "high-resistance" state, e.g., an electrically non-conductive state. When a voltage applied between the two terminals is higher than the threshold value, the switching element changes to a "low-resistance" state, e.g., an electrically conductive state. The switching element may have this function regardless of the polarity of the voltage. The switching element comprises at least one chalcogen element selected from the group consisting of tellurium (Te), selenium (Se), and sulfur (S). The switching element may comprise a chalcogenide, which is a compound containing the above-described chalcogen element. The switching element may also comprise at least one element selected from the group consisting of boron (B), aluminum (Al), gallium (Ga), indium (In), carbon (C), silicon (Si), germanium (Ge), tin (Sn), arsenic (As), phosphorus (P), and antimony (Sb). The Z-direction thickness (e.g., the maximum thickness) of the selector layer 50 is, for example, smaller than the Z-direction thickness (e.g., the maximum thickness) of the storage layer 30.

The third conductive layer 60 is provided between the selector layer 50 and the word line WL. The third conductive layer 60 functions to electrically connect the selector layer 50 and the word line WL. The third conductive layer 60 may be made of, for example, carbon (C), carbon nitride (CN) or the like, tungsten (W) or the like, polycrystalline silicon doped with an N-type impurity such as phosphorus (P), or the like, or other conductive material such as tungsten carbide (WC), tungsten carbonitride (WCN), or tungsten carbonitride silicide (WCNSi). The Z-direction thickness (e.g., the maximum thickness) of the third conductive layer 60 is, for example, smaller than the Z-direction thickness (e.g., the maximum thickness) of the storage layer 30.

The liner film 70 (first insulating film) is an insulating film that covers the memory cell MC, a part of the word line WL, and a part of the bit line BL. As shown in FIGS. 3 and 4, the liner film 70 covers the circumferences (peripheral surfaces in the X and Y directions) of the first conductive layer 20, the storage layer 30, the second conductive layer 40, the selector layer 50, and the third conductive layer 60. Thus, the liner film 70 covers the memory cell MC. Further, the liner film 70 covers a part of the word line WL and a part of the bit line BL. Assuming, in FIGS. 3 and 4, a direction toward the bit line BL as upward and a direction toward the interlayer insulating layer 12 as downward in the third direction, the liner film 70 covers those areas of the upper and side surfaces of the word line WL and the bit line BL on which the memory cell MC is not formed. As shown in FIG. 3, the Y-direction thickness (e.g., the maximum thickness) of the liner film 70 is, for example, 3 nm to 5 nm.

The interlayer insulating film 38 is provided between the liner film 70 covering the first memory cell MC and the liner film 70 covering the second memory cell MCy. The Y-direction thickness of the liner film 70 in contact with the first memory cell MC is smaller than the Y-direction thickness of the interlayer insulating film 38. The X-direction thickness of the liner film 70 in contact with the first memory cell MC is smaller than the X-direction thickness of the interlayer insulating film 38. The thickness of the liner film 70 is constant. The liner film 70 extends in the Z direction along the first memory cell MC. Part of the liner film 70 is provided along the surface of the interlayer insulating layer 12 exposed between the first memory cell MC and the second memory cell MCy.

The liner film 70 is a SiON film composed of Si, O and N. The liner film 70 has an N region 72, an O region 73 and a boundary 74 (at which the N content is equal to the O content) in the third direction. The atomic ratio (N/O) between N and O is not less than 1.0 in the N region 72. Thus, the boundary 74 is included in the N region 72. The atomic ratio (N/O) between N and O is less than 1.0 in the O region 73. In the first embodiment, the boundary 74 lies between the bit line BL-side end surface of the second conductive layer 40 and the word line WL-side end surface of the second conductive layer 40.

Figure 5:
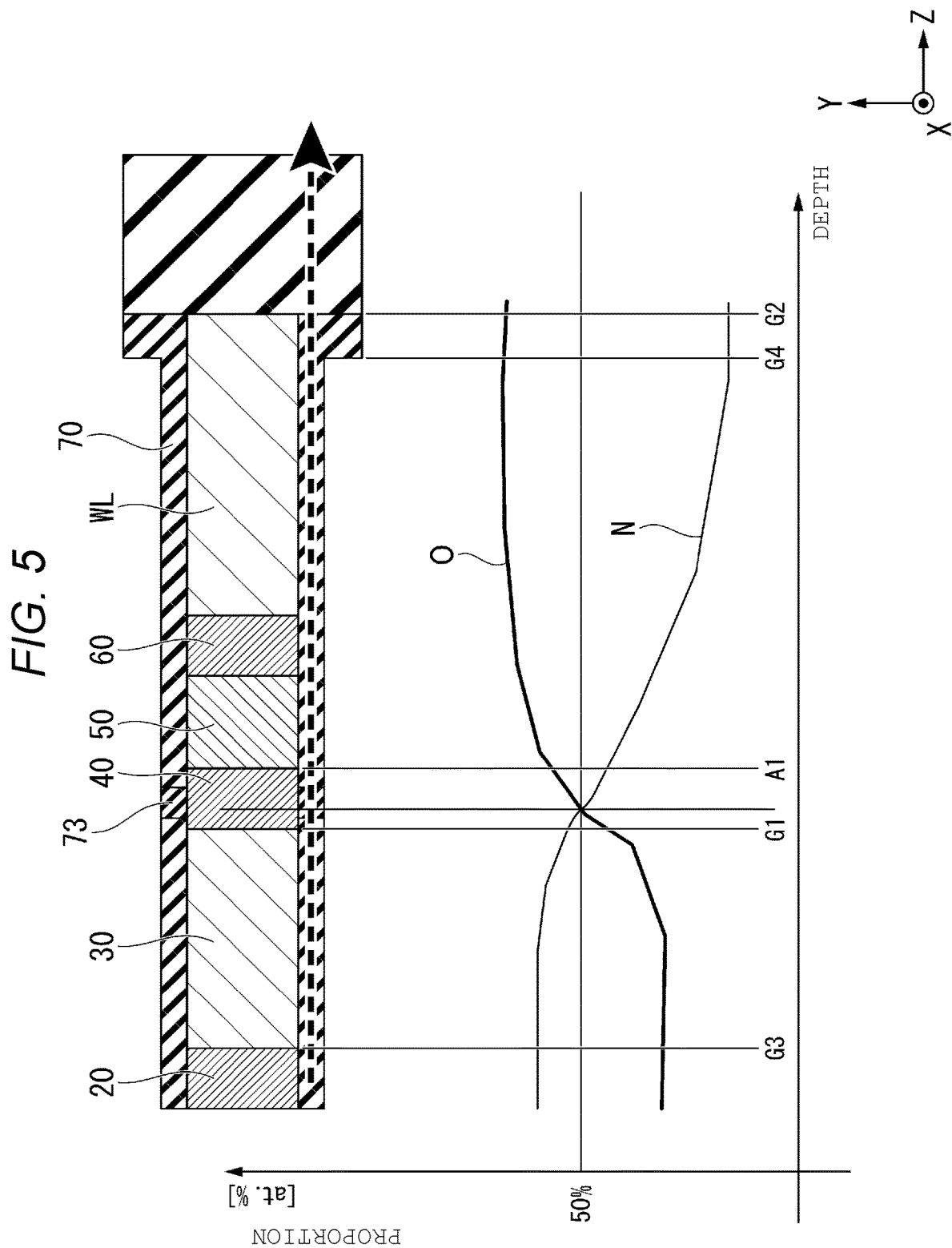
FIG. 5 is a diagram showing a relationship between a position in a memory cell according to the first embodiment and the results of measurement of EDX.

FIG. 5 shows a relationship between a position in a memory cell according to the first embodiment and the results of an energy dispersive X-ray analysis. The upper schematic diagram of FIG. 5 shows the positional relationship in the memory cell, and the lower graph of FIG. 5 shows the results of an energy dispersive X-ray analysis performed in the direction shown by the dashed arrow. In the graph of FIG. 5, the ordinate axis represents the ratio of 0 or N in at. %, and the abscissa axis represents the depth.

In the first embodiment, as shown in FIG. 5, at a first position G1, which is the position of the word line WL-side (lower) end surface of the storage layer 30 in the Z direction (third direction), the atomic ratio (N/O) between N and O in the liner film 70 is not less than 1.0. The atomic ratio (N/O) between N and O in the liner film 70 at the first position G1 may be not less than 1.5. The atomic ratio (N/O) between N and O in the liner film 70 at the first position G1 may be not less than 7/3. In the first embodiment, the first position G1 coincides with the position of the interface between the storage layer 30 and the second conductive layer 40.

In the range from the first position G1 to a third position G3, which is the position of the bit line (first interconnect) BL-side end surface (upper end surface) of the storage layer 30 in the Z direction, the atomic ratio (N/O) between N and O in the liner film 70 is, for example, not less than 1.0. In the first embodiment, the third position G3 coincides with the position of the interface between the first conductive layer 20 and the storage layer 30.

In the first embodiment, at a second position G2, which is the position of the (lower) end surface of the word line (second interconnect) WL, opposite to the selector layer 50-side end surface, in the Z direction, the atomic ratio (N/O) between N and O in the liner film 70 is less than 1.0. The atomic ratio (N/O) between N and O in the liner film 70 at the second position G2 may be not more than 0.5. In the first embodiment, the second position G2 coincides with the position of the interface between the interlayer insulating layer 12 and the word line WL.

A fourth position G4 is herein defined as a position which lies away from the second position G2 toward the bit line BL in the Z direction by a first distance which is equal to the minimum thickness of the liner film 70 in the first direction. In the range from the second position G2 to the fourth position G4 in the Z direction, the atomic ratio (N/O) between N and O in the liner film 70 is, for example, less than 1.0. In the range of the first distance from the second position G2 toward the bit line BL in the Z direction (the range from G2 to G4), the atomic ratio (N/O) between N and O in the liner film 70 may be not more than 0.5.

In the range from the second position G2 to the position of the bit line BL-side end surface of the selector layer 50 in the Z direction, the atomic ratio (N/O) between N and O in the liner film 70 is, for example, less than 1.0.

The contents (at. %) of Si, N and O atoms in the liner film 70 can be measured by energy dispersive X-ray analysis (EDX) that accompanies transmission electron microscope (TEM). The above-described atomic ratio can be determined from the contents (at. %) of the respective elements.

(Semiconductor Memory Device Manufacturing Method)

A method for manufacturing the semiconductor memory device 1 will now be described. FIG. 6 illustrates a step of manufacturing memory cells MC, and shows cross-sectional views of a stacked structure for the formation of a word line WL and a pillar 31. The upper diagrams of FIGS. 6 through 15 are cross-sectional views of a constituent portion, as viewed in the X direction, at different manufacturing steps, while the lower diagrams of FIGS. 6 through 15 are cross-sectional views of the constituent portion, as viewed in the Y direction, at the different manufacturing steps.

As shown in FIG. 6, an interlayer insulating layer 12, a second interconnect film WL1, a third conductive film 61, a selector layer-forming film 51, a second conductive film 41, a storage layer-forming film 31, and a first conductive film 21, which extend in the X and Y directions and stacked in the Z direction, are formed sequentially. The second interconnect film WL1 is formed of, for example, tungsten (W). The interlayer insulating layer 12 is formed of, for example, SiO$_2$. Though not shown diagrammatically, the interlayer insulating layer 12 is formed on a silicon substrate 11.

FIG. 7 illustrates an example step for manufacturing the memory cells MC, and shows cross-sectional views illustrating a groove formation step. As shown in FIG. 7, grooves Gr are formed by, for example, patterning at predetermined intervals in the Y direction. The grooves Gr extend in the X direction, and penetrate the second interconnect film WL1, the third conductive film 61, the selector layer-forming film 51, the second conductive film 41, the storage layer-forming film 31, and the first conductive film 21 in the Z direction. The second interconnect film WL1, the third conductive film 61, the selector layer-forming film 51, the second conductive film 41, the storage layer-forming film 31, and the first conductive film 21 are divided by the grooves Gr into segments arranged at intervals in the Y direction (the second interconnect film WL1 is divided into word lines WL).

FIG. 8 illustrates an example step for manufacturing the memory cells MC, and shows cross-sectional views illustrating a SiO film formation step. As shown in FIG. 8, a silicon oxide film (SiO film) 75 having a predetermined thickness is formed by, for example, plasma-enhanced ALD (Atomic Layer Deposition) or CVD (Chemical Vapor Deposition) on the first conductive film 21, which is exposed when viewed in the Z direction, the storage layer-forming film 31, the second conductive film 41, the selector layer-forming film 51, the third conductive film 61, and the word line WL.

FIG. 9 illustrates an example step for manufacturing the memory cells MC, and shows cross-sectional views illustrating a nitriding step. As shown in FIG. 9, the silicon oxide film (SiO film) 75 is partly nitrided by, for example, plasma nitriding to form an N region 72. In particular, nitrogen is supplied to a second portion of the SiO film 75, which covers the side surface of the storage layer-forming film 31 (for forming a storage layer 30), so that the second portion will contain a larger amount of nitrogen than a first portion of the SiO film 75, which covers the side surface of a part of the word line WL. The SiO film in contact with the first conductive film 21 and with the storage layer-forming film 31 can be selectively nitrided by adjusting the pressure, biasing conditions, and the processing time in the nitriding step.

FIG. 10 illustrates an example step for manufacturing the memory cells MC, and shows cross-sectional views illustrating an interlayer insulating film formation step. As shown in FIG. 10, an interlayer insulating film 38 is formed by, for example, ALD or CVD such that the pillar 92 becomes entirely embedded in the interlayer insulating film 38. The interlayer insulating film 38 is formed of, for example, $SiO_2$. The Z-direction size of the interlayer insulating film 38 is larger than the Z-direction size of the pillar 92.

FIG. 11 illustrates an example step for manufacturing the memory cells MC, and shows cross-sectional views illustrating an interlayer insulating film partial removal step. As shown in FIG. 11, the interlayer insulating film 38 is polished and removed in the Z direction toward the interlayer insulating layer 12 until the first conductive film 21 becomes exposed. A plurality of pillars 92 are formed by the interlayer insulating film partial removal step at intervals at positions where the pillars 92 overlap the word lines WL in the Y direction. The interlayer insulating film 38 lies between adjacent word lines WL and adjacent pillars 92 in the Y direction. The end surfaces of the interlayer insulating film 38 and the first conductive film 21, opposite to their word line WL-side end surfaces, lie in the same plane and are both smooth.

FIG. 12 illustrates an example step for manufacturing the memory cells MC, and shows cross-sectional views illustrating a step of forming a first interconnect film for the formation of bit lines BL. As shown in FIG. 12, a first interconnect film BL1 is formed by, for example, PVD (Physical Vapor Deposition) or CVD on the end surfaces of the interlayer insulating film 38 and the first conductive film 21, which are exposed when viewed in the Z direction. The first interconnect film BL1 is formed of, for example, tungsten (W).

Figure 13:
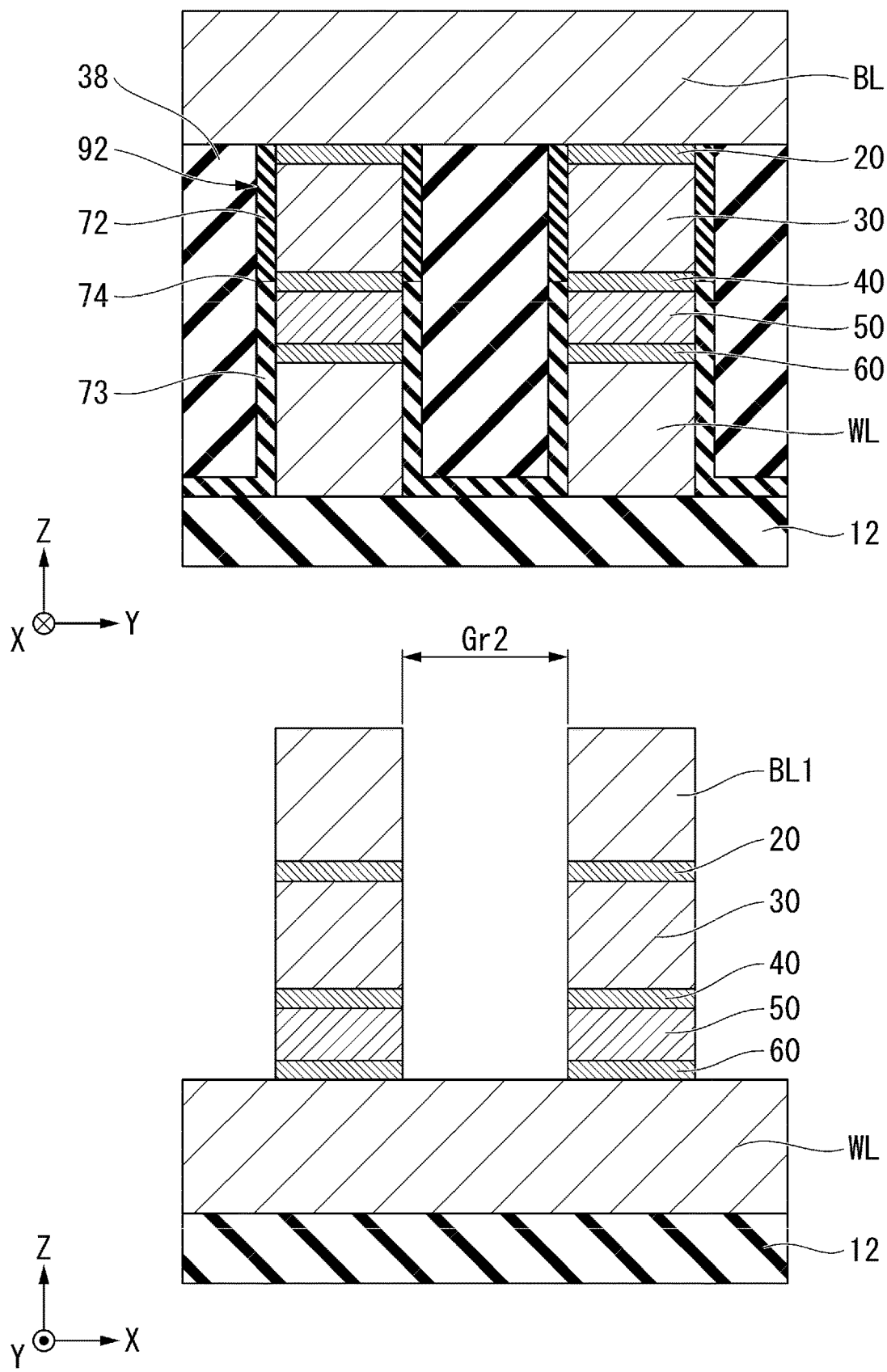
FIG. 13 shows cross-sectional views illustrating an example step for manufacturing the memory cells according to the first embodiment.

FIG. 13 illustrates an example step for manufacturing the memory cells MC, and shows cross-sectional views illustrating a bit line formation step. As shown in FIG. 13, grooves Gr2 are formed by, for example, patterning at predetermined intervals in the X direction. The grooves Gr2 penetrate the third conductive film 61, the selector layer-forming film 51, the second conductive film 41, the storage layer-forming film 31, the first conductive film 21, and the first interconnect film BL1 in the Z direction. A first conductive layer 20, a storage layer 30, a second conductive layer 40, a selector layer 50, and a third conductive layer 60 are formed by the formation of the grooves Gr2. Further, a plurality of bit lines BL are formed at predetermined intervals in the X direction by the bit line formation step.

Figure 14:
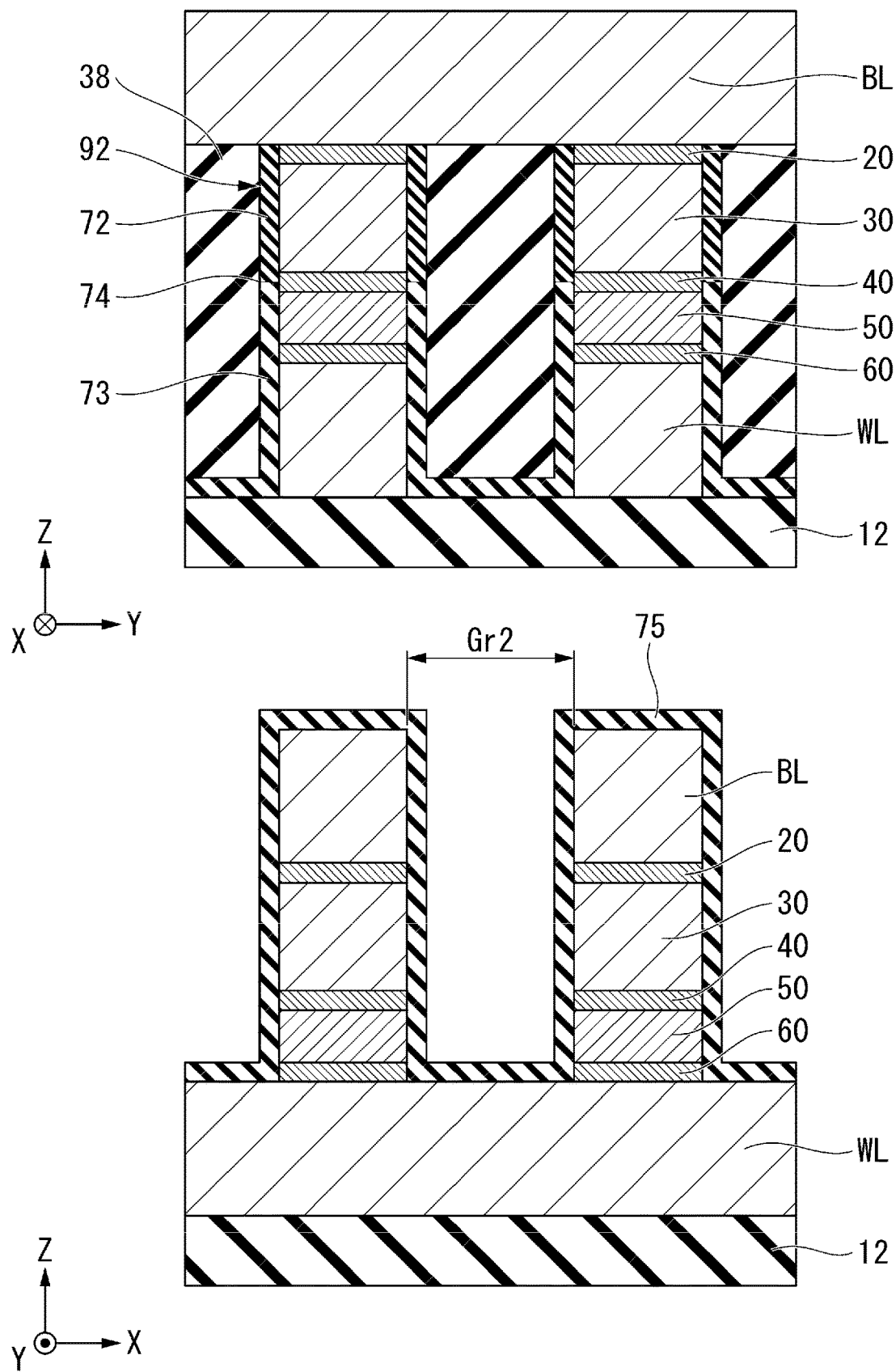
FIG. 14 shows cross-sectional views illustrating an example step for manufacturing the memory cells according to the first embodiment.

FIG. 14 illustrates an example step for manufacturing the memory cells MC, and shows cross-sectional views illustrating a second SiO film formation step. As shown in FIG. 14, a SiO film 75 having a predetermined thickness is formed by, for example, plasma-enhanced ALD (Atomic Layer Deposition) or CVD (Chemical Vapor Deposition) on the bit line BL, which is exposed when viewed in the Z direction, the first conductive layer 20, the storage layer 30, the second conductive layer 40, the selector layer 50, the third conductive layer 60, and the word line WL.

Figure 15:
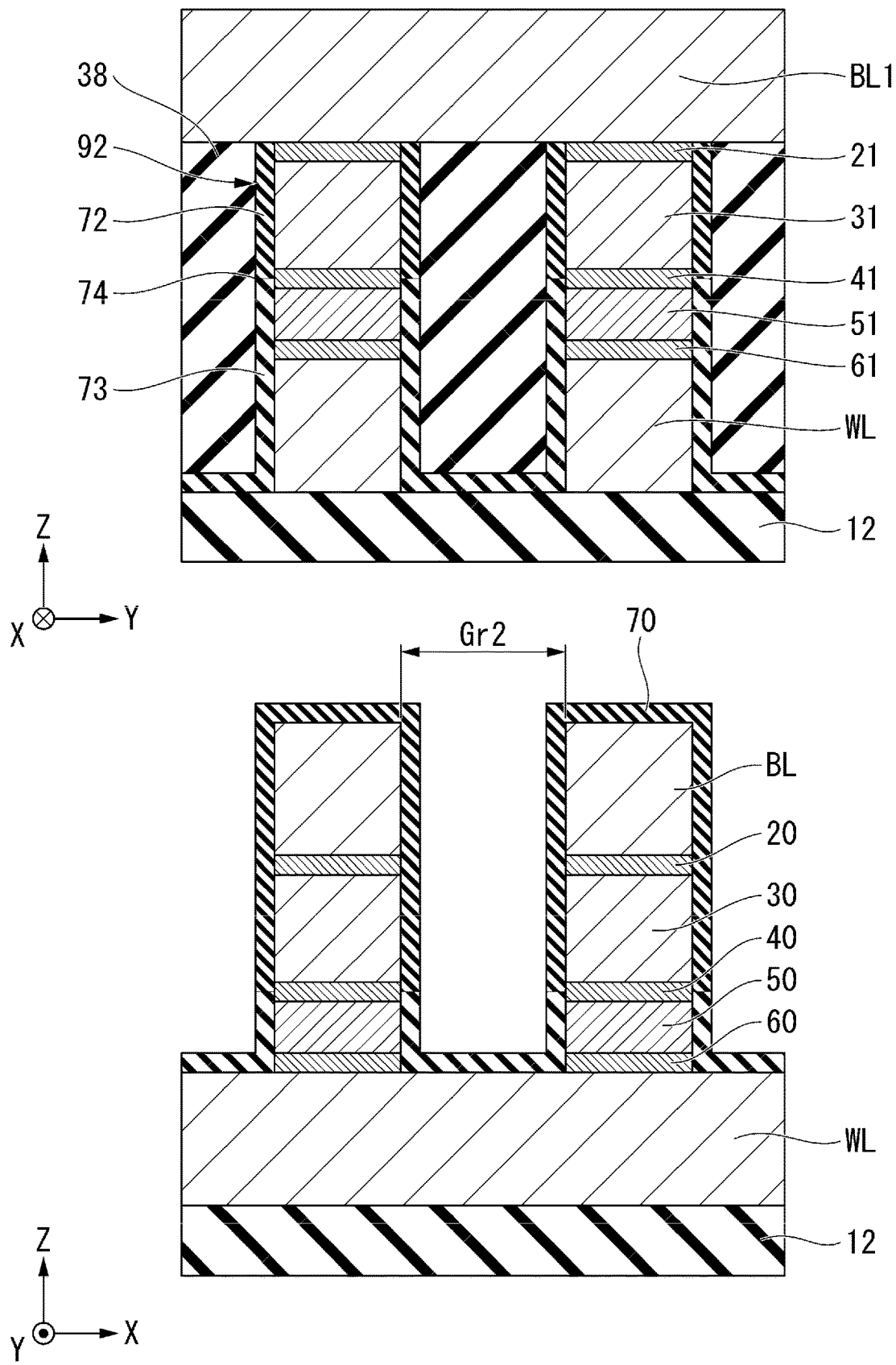
FIG. 15 shows cross-sectional views illustrating an example step for manufacturing the memory cells according to the first embodiment.

FIG. 15 illustrates an example step for manufacturing the memory cells MC, and shows cross-sectional views illustrating a second nitriding step. As shown in FIG. 15, the SiO film 75 is partly nitrided by, for example, plasma nitriding to form an N region 72, thereby obtaining a liner film 70.

The memory cells MC shown in FIGS. 3 and 4 can be manufactured by performing the above steps. The semiconductor memory device 1 is formed by performing known pre-processing before the above steps and known post-processing after the above steps. It is to be noted, however, that a method for manufacturing the semiconductor memory device 1 is not limited to the above-described method.

Effects of the above-described semiconductor memory device 1 of the first embodiment will now be described. According to the semiconductor memory device 1, the atomic ratio (N/O) between N and O in the liner film 70 is not less than 1.0 at the first position G1. This can prevent $H_2O$ and O from entering the storage layer 30. Thus, the effect of $H_2O$ and O from the interlayer insulating film 38 on the storage layer 30 can be prevented. The atomic ratio (N/O) between N and O in the liner film 70 is less than 1.0 at the second position G2. This can achieve excellent pressure resistance and can prevent RC delay.

While the above-described semiconductor memory device 1 of the first embodiment is provided with the first conductive layer 20, the second conductive layer 40, and the third conductive layer 60, it is not always necessary to provide all these layers. When the first conductive layer 20 is absent, the third position G3 coincides with the position of the interface between the bit line BL and the storage layer 30. When the second conductive layer 40 is absent, the first position G1 coincides with the position of the interface between the storage layer 30 and the selector layer 50.

In the first embodiment, a not-shown fourth conductive layer may be provided between the first conductive layer 20 and the storage layer 30. The fourth conductive layer may be composed of tungsten.

In the first embodiment, the atomic ratio (N/O) between N and O in the liner film 70 in contact with the first conductive layer 20 may be, for example, not less than 1.0.

In the method for manufacturing the semiconductor memory device of the first embodiment, the SiO film formation step and the nitriding step may be performed successively in a single apparatus.

Second Embodiment

A second embodiment will now be described. Though not shown diagrammatically, as with the semiconductor memory device 1 according to the first embodiment, a semiconductor memory device according to the second embodiment is a so-called cross-point type semiconductor memory device using a PCM. The semiconductor memory device of the second embodiment includes, for example, a silicon substrate 11, an interlayer insulating layer 12, a plurality of word lines WL, a plurality of bit lines BL, and a plurality of memory cells MC. The following description will be given of only those components or elements of the semiconductor memory device of the second embodiment which differ from the components or elements of the semiconductor memory device 1, and a detailed description of common components or elements will be omitted.

Figure 16:
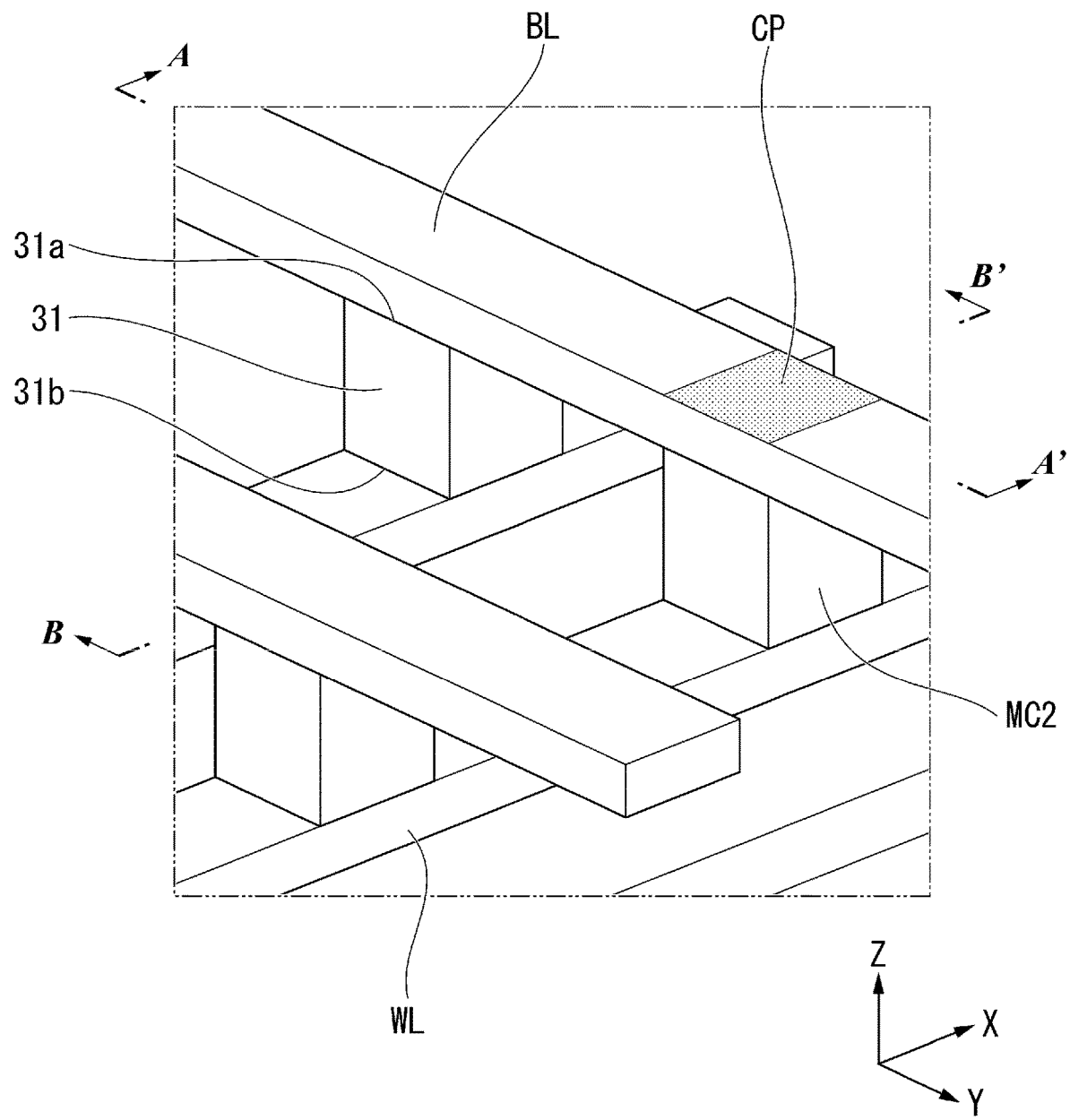
FIG. 16 is a perspective view of memory cells according to a second embodiment.
Figure 17:
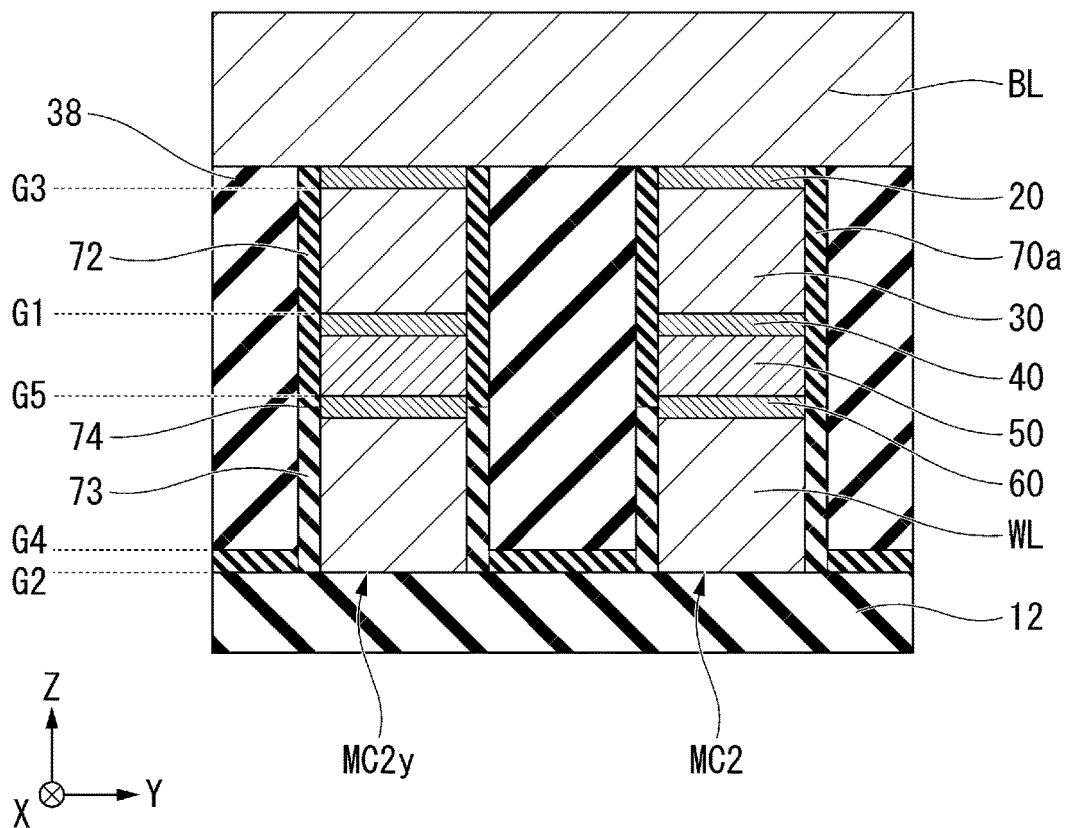
FIG. 17 is a cross-sectional view of the memory cells on the line A-A' of FIG. 16.
Figure 18:
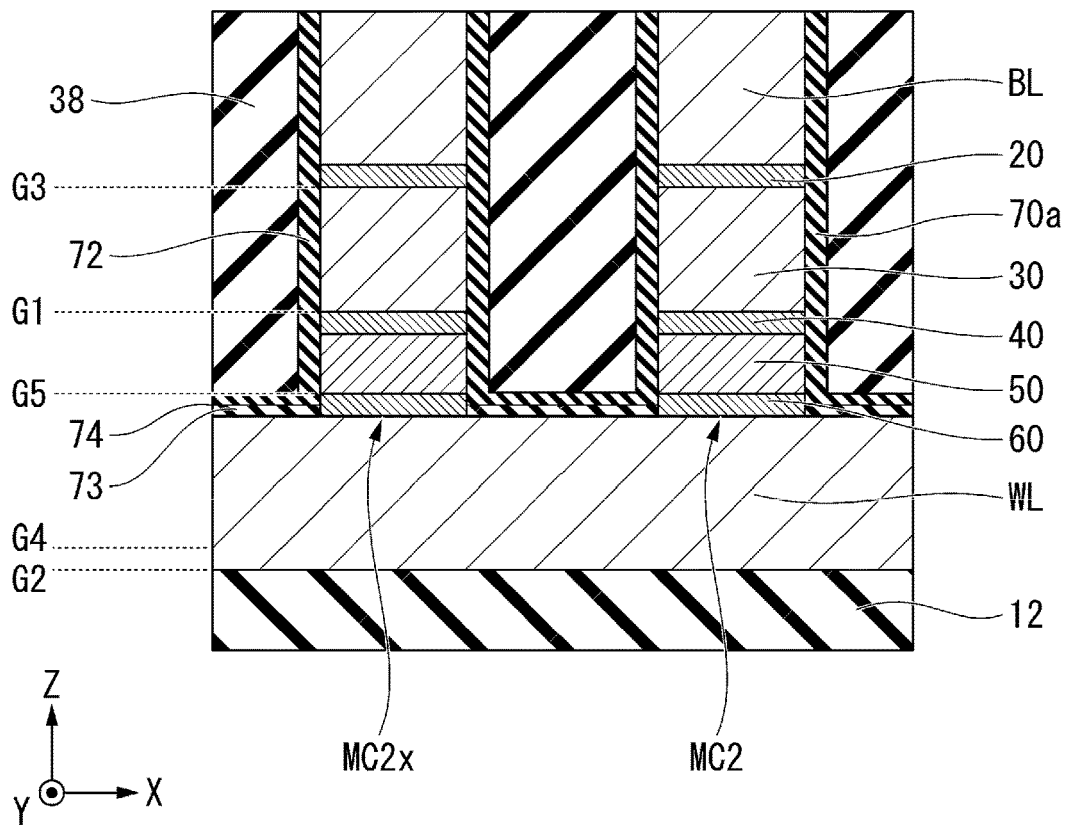
FIG. 18 is a cross-sectional view of the memory cells on the line B-B' of FIG. 16.

FIG. 16 is a perspective view of memory cells MC2 according to the second embodiment. FIG. 17 is a cross-sectional view of the memory cells MC2 on the line A-A' of FIG. 16. FIG. 18 is a cross-sectional view of the memory cells MC2 on the line B-B' of FIG. 16. A memory cell is now referred to as a memory cell MC2, a memory cell which is adjacent to the memory cell MC2 via the interlayer insulating film 38 in the Y direction is referred to as a memory cell MC2y, and a memory cell which is adjacent to the memory cell MC2 via the interlayer insulating film 38 in the X direction is referred to as a memory cell MC2x.

A liner film 70a (first insulating film) is an insulating film that covers the memory cell MC2, a part of the word line WL, and a part of the bit line BL. As shown in FIGS. 17 and 18, the liner film 70a covers the circumferences of a first conductive layer 20, a storage layer 30, a second conductive layer 40, a selector layer 50, and a third conductive layer 60. Thus, the liner film 70a covers the circumference of the memory cell MC2. Further, the liner film 70a covers a part of the word line WL and a part of the bit line BL. Assuming, in FIGS. 17 and 18, a direction toward the bit line BL as upward and a direction toward the interlayer insulating layer 12 as downward in the third direction, the liner film 70a covers those areas of the upper and side surfaces of the word line WL and the bit line BL on which the memory cell MC2 is not formed. As shown in FIG. 18, the Y-direction thickness (e.g., the maximum thickness) of the liner film 70a is, for example, 3 nm to 5 nm.

The interlayer insulating film 38 is provided between the liner film 70a covering the memory cell MC2 and the liner film 70a covering the memory cell MC2y. The Y-direction thickness of the liner film 70a in contact with the memory cell MC2 is smaller than the Y-direction thickness of the interlayer insulating film 38. The X-direction thickness of the liner film 70a in contact with the memory cell MC2 is smaller than the X-direction thickness of the interlayer insulating film 38. The thickness of the liner film 70a is constant. The liner film 70a extends in the Z direction along the memory cell MC2. Part of the liner film 70a is provided along the surface of the interlayer insulating layer 12 exposed between the memory cell MC2 and the second memory cell MC2y.

The liner film 70a is a SiON film composed of Si, 0 and N. The liner film 70a has an N region 72, an O region 73 and a boundary 74 (at which the N content is equal to the O content) in the third direction. The atomic ratio (N/O) between N and O is not less than 1.0 in the N region 72. Thus, the boundary 74 is included in the N region 72. The atomic ratio (N/O) between N and O is less than 1.0 in the O region 73.

In the second embodiment, at a first position G1, which is the position of the word line WL-side (second interconnect-side) end surface of the storage layer 30 in the Z direction (third direction), the atomic ratio (N/O) between N and O in the liner film 70a is not less than 1.0. The atomic ratio (N/O) between N and O in the liner film 70a at the first position G1 may be not less than 1.5. The atomic ratio (N/O) between N and O in the liner film 70a at the first position G1 may be not less than 7/3. In the second embodiment, the first position G1 coincides with the position of the interface between the storage layer 30 and the second conductive layer 40.

In the range from the third position G3 to a fifth position G5, which is the position of the word line (second interconnect) WL-side end surface (lower end surface) of the selector layer 50 in the Z direction, the atomic ratio (N/O) between N and O in the liner film 70a is, for example, not less than 1.0. In the second embodiment, the fifth position G5 coincides with the position of the interface between the selector layer 50 and the third conductive layer 60.

In the range from the position of the storage layer 30-side end surface of the word line WL to a second position G2 which is the position of the end surface of the word line (second interconnect) WL, opposite to the selector layer 50-side end surface, in the Z direction, the atomic ratio (N/O) between N and O in the liner film 70a is less than 1.0. The position of the storage layer 30-side end surface of the word line WL coincides with the position of the interface between the third conductive layer 60 and the word line WL.

In a region of the liner film 70a, which lies at least at a second distance from the surface of the word line WL in the Y direction, the atomic ratio (N/O) between N and O is not less than 1.0. The second distance herein refers to the minimum thickness of the liner film 70a in the Y direction.

In the second embodiment, in a region of the liner film 70a, which lies at a distance of not more than the second distance from the surface of the word line WL in the Y direction and which lies at the second position G2, the atomic ratio (N/O) between N and O is less than 1.0. The atomic ratio (N/O) between N and O in this region of the liner film 70a may be not more than 0.5. In the second embodiment, the second position G2 coincides with the position of the interface between the interlayer insulating layer 12 and the word line WL.

As described above, the contents (at. %) of Si, N and O atoms in the liner film 70a can be measured by energy dispersive X-ray analysis (EDX) that accompanies transmission electron microscope (TEM). The above-described atomic ratio can be determined from the contents (at. %) of the respective elements.

A method for manufacturing the memory cells MC2 of the semiconductor memory device according to the second embodiment will now be described. The memory cells MC2 of the semiconductor memory device according to the second embodiment can be manufactured by the same steps as those of the method for manufacturing the semiconductor memory device 1 except for the nitriding step.

In the nitriding step of the method for manufacturing the semiconductor memory device according to the second embodiment, the SiO film 75 is partly nitrided by, for example, plasma nitriding. The SiO film in contact with the first conductive layer 20, the storage layer 30, the second conductive layer 40, and the selector layer 50 can be selectively nitrided by adjusting the pressure, biasing conditions, and the processing time in the nitriding step. Further, as shown in FIG. 17, a region of the liner film 70a in contact with the interlayer insulating layer 12 can be nitrided.

Effects of the above-described semiconductor memory device of the second embodiment will now be described. According to the semiconductor memory device of the second embodiment, the atomic ratio (N/O) between N and O in the liner film 70a is not less than 1.0 in the range from the third position G3 to the fifth position G5. This can prevent $H_2O$ and O from entering the storage layer 30 and the selector layer 50. Thus, the effect of $H_2O$ and O from the interlayer insulating film 38 on the storage layer 30 can be more effectively prevented. The atomic ratio (N/O) between N and O in the liner film 70a is less than 1.0 in the range from the position of the storage layer 30-side end surface of the word line WL to the second position G2 in the Z direction. This can achieve excellent pressure resistance and can prevent RC delay.

Third Embodiment

A third embodiment will now be described. Though not shown diagrammatically, as with the semiconductor memory device 1 according to the first embodiment, a semiconductor memory device according to the third embodiment is a so-called cross-point type semiconductor memory device using a PCM. The semiconductor memory device of the third embodiment includes, for example, a silicon substrate 11, an interlayer insulating layer 12, a plurality of word lines WL, a plurality of bit lines BL, and a plurality of memory cells MC. The following description will be given of only those components or elements of the semiconductor memory device of the third embodiment which differ from the components or elements of the semiconductor memory device 1, and a detailed description of common components or elements will be omitted.

Figure 19:
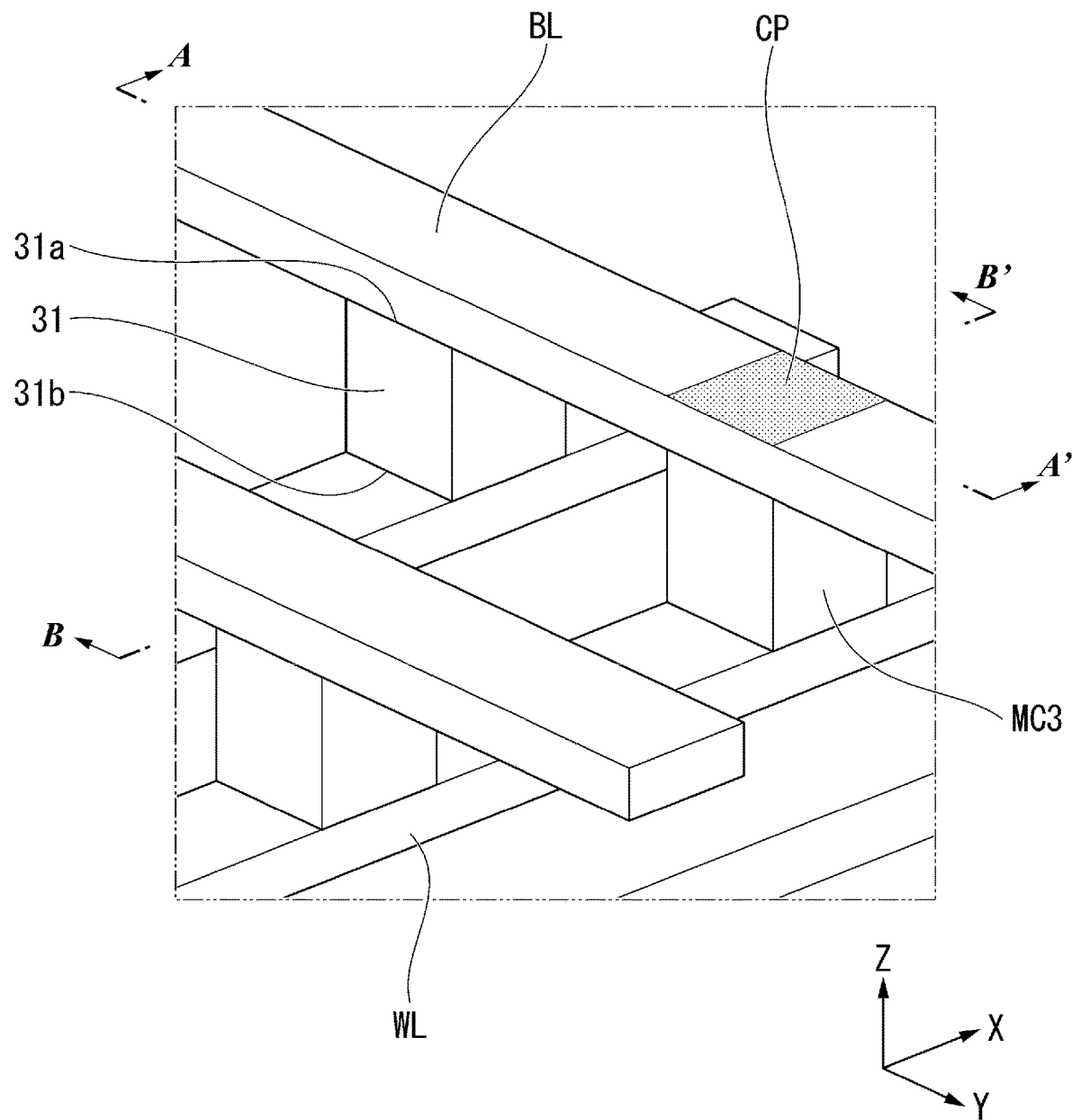
FIG. 19 is a perspective view of memory cells according to a third embodiment.
Figure 20:
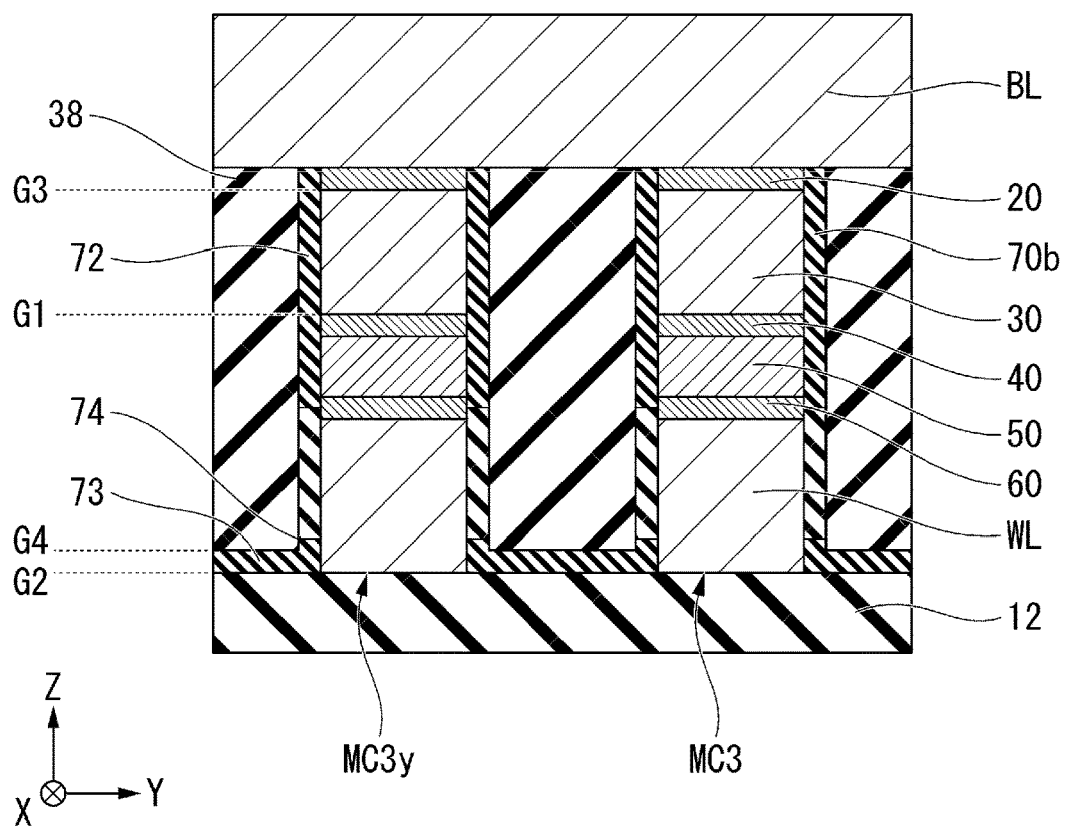
FIG. 20 is a cross-sectional view of the memory cells on the line A-A' of FIG. 19.
Figure 21:
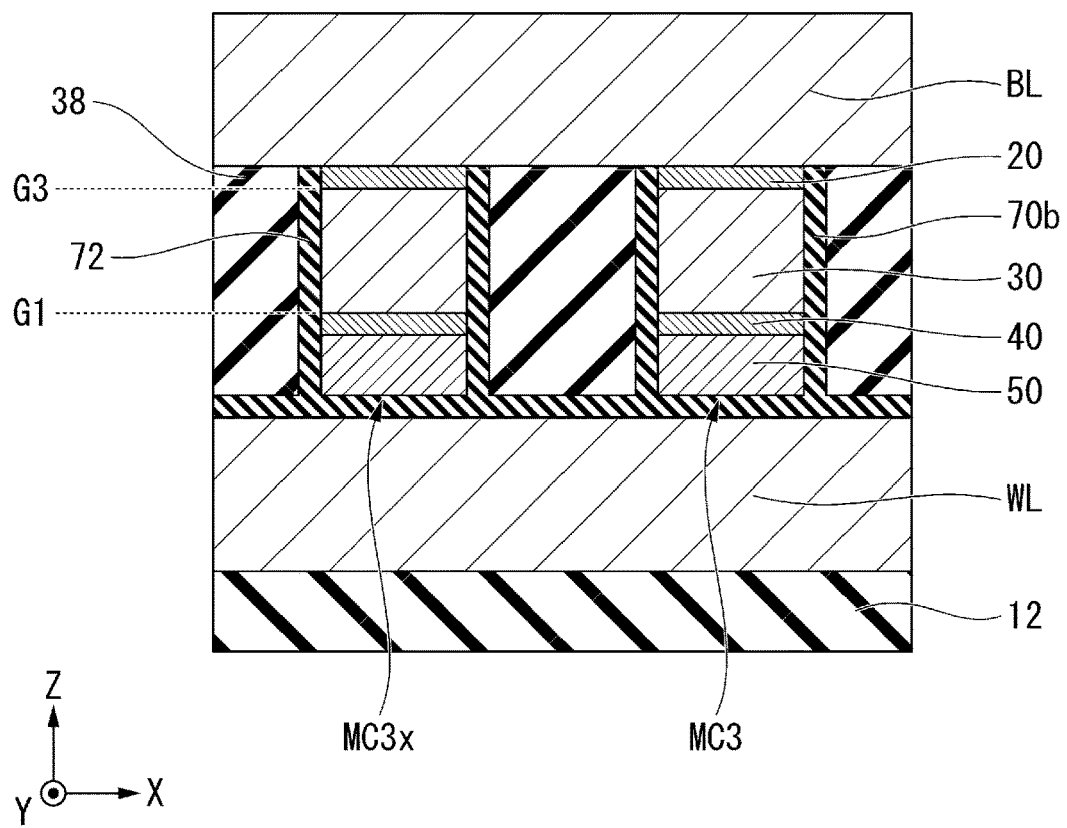
FIG. 21 is a cross-sectional view of the memory cells on the line B-B' of FIG. 19.

FIG. 19 is a perspective view of memory cells MC3 according to the third embodiment. FIG. 20 is a cross-sectional view of the memory cells MC3 on the line A-A' of FIG. 19. FIG. 21 is a cross-sectional view of the memory cells MC3 on the line B-B' of FIG. 19. A memory cell is now referred to as a memory cell MC3, a memory cell which is adjacent to the memory cell MC3 via the interlayer insulating film 38 in the Y direction is referred to as a memory cell MC3y, and a memory cell which is adjacent to the memory cell MC3 via the interlayer insulating film 38 in the X direction is referred to as a memory cell MC3x.

A liner film 70b (first insulating film) is an insulating film that covers a part of the word line WL, a part of the bit line BL, and the memory cell MC3. As shown in FIGS. 20 and 21, the liner film 70b covers the circumferences of a first conductive layer 20, a storage layer 30, a second conductive layer 40, a selector layer 50, and a third conductive layer 60. Thus, the liner film 70b covers the circumference of the memory cell MC3. Further, the liner film 70b covers a part of the word line WL and a part of the bit line BL. Assuming, in FIGS. 20 and 21, a direction toward the bit line BL as upward and a direction toward the interlayer insulating layer 12 as downward in the third direction, the liner film 70b covers those areas of the upper and side surfaces of the word line WL and the bit line BL on which the memory cell MC3 is not formed. As shown in FIG. 20, the Y-direction thickness (e.g., the maximum thickness) of the liner film 70b is, for example, 3 nm to 5 nm.

The liner film 70b is composed of Si, O and N. The liner film 70b has an N region 72, an O region 73 and a boundary 74 (at which the N content is equal to the O content) in the third direction. The atomic ratio (N/O) between N and O is not less than 1.0 in the N region 72. Thus, the boundary 74 is included in the N region 72. The atomic ratio (N/O) between N and O is less than 1.0 in the O region 73.

The interlayer insulating film 38 is provided between the liner film 70b covering the memory cell MC3 and the liner film 70b covering the memory cell MC3y. The Y-direction thickness of the liner film 70b in contact with the memory cell MC3 is smaller than the Y-direction thickness of the interlayer insulating film 38. The X-direction thickness of the liner film 70b in contact with the memory cell MC3 is smaller than the X-direction thickness of the interlayer insulating film 38. The thickness of the liner film 70b is constant. The liner film 70b extends in the Z direction along the memory cell MC3. Part of the liner film 70b is provided along the surface of the interlayer insulating layer 12 exposed between the memory cell MC3 and the second memory cell MC3y.

In the third embodiment, at a first position G1, which is the position of the word line WL-side (second interconnect-side) end surface of the storage layer 30 in the Z direction (third direction), the atomic ratio (N/O) between N and O in the liner film 70b is not less than 1.0. The atomic ratio (N/O) between N and O in the liner film 70b at the first position G1 may be not less than 1.5. The atomic ratio (N/O) between N and O in the liner film 70b at the first position G1 may be not less than 7/3. In the third embodiment, the first position G1 coincides with the position of the interface between the storage layer 30 and the second conductive layer 40.

In the third embodiment, the atomic ratio (N/O) between N and O in the liner film 70b at the second position G2 is less than 1.0. The atomic ratio (N/O) between N and O in the liner film 70b at the second position G2 may be not more than 0.5. In the third embodiment, the second position G2 coincides with the position of the interface between the interlayer insulating layer 12 and the word line WL.

In the range from the second position G2 to the fourth position G4 in the Z direction, the atomic ratio (N/O) between N and O in the liner film 70b is, for example, less than 1.0.

In the range from the third position G3 to the fourth position G4, excluding the fourth position G4, in the Z direction, the atomic ratio (N/O) between N and O in the liner film 70b is, for example, not less than 1.0.

As described above, the contents (at. %) of Si, N and O atoms in the liner film 70b can be measured by energy dispersive X-ray analysis (EDX) that accompanies transmission electron microscope (TEM). The above-described atomic ratio can be determined from the contents (at. %) of the respective elements.

A method for manufacturing the memory cells MC3 of the semiconductor memory device according to the third embodiment will now be described. The memory cells MC3 of the semiconductor memory device according to the third embodiment can be manufactured by the same steps as those of the method for manufacturing the semiconductor memory device 1 except for the nitriding step.

In the nitriding step of the method for manufacturing the semiconductor memory device according to the third embodiment, the SiO film 75 is partly nitrided by, for example, plasma nitriding. The SiO film in contact with the first conductive layer 20, the storage layer 30, the second conductive layer 40, the selector layer 50, and a part of the word line WL can be selectively nitrided by adjusting the pressure, biasing conditions, and the processing time in the nitriding step.

Effects of the above-described semiconductor memory device of the third embodiment will now be described. According to the semiconductor memory device of the third embodiment, the atomic ratio (N/O) between N and O in the liner film 70b is not less than 1.0 in a region in contact with the first conductive layer 20, the storage layer 30, the second conductive layer 40, the selector layer 50, and a part of the word line WL. This can prevent $H_2O$ and O from entering the storage layer 30, the selector layer 50, and the word line WL. Thus, the effect of $H_2O$ and O from the interlayer insulating film 38 can be more effectively prevented. The atomic ratio (N/O) between N and O in the liner film 70b is less than 1.0 in the range from the second position G2 to the fourth position G4 in the Z direction. This can achieve excellent pressure resistance and can prevent RC delay.

Fourth Embodiment

A fourth embodiment will now be described. Though not shown diagrammatically, as with the semiconductor memory device 1 according to the first embodiment, a semiconductor memory device according to the fourth embodiment is a so-called cross-point type semiconductor memory device using a PCM. The semiconductor memory device of the fourth embodiment includes, for example, a silicon substrate 11, an interlayer insulating layer 12, a plurality of word lines WL, a plurality of bit lines BL, and a plurality of memory cells MC. The following description will be given of only those components or elements of the semiconductor memory device of the fourth embodiment which differ from the components or elements of the semiconductor memory device 1, and a detailed description of common components or elements will be omitted.

Figure 22:
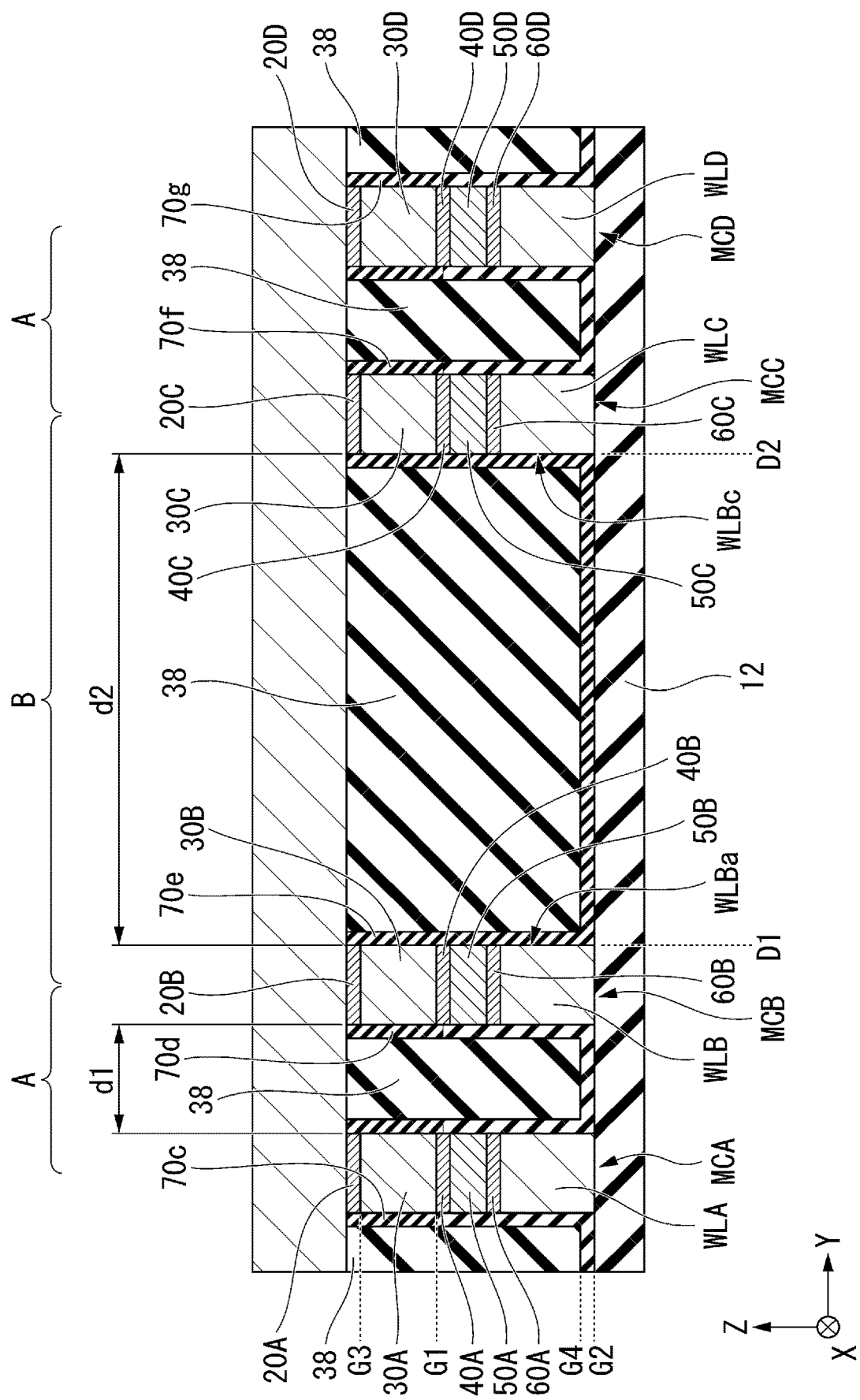
FIG. 22 is a cross-sectional view of memory cells according to a fourth embodiment.

FIG. 22 is a diagram showing memory cells MC arranged in the Y direction in the semiconductor memory device according to the fourth embodiment. As shown in FIG. 22, a memory cell is now referred to as a memory cell MCA. A memory cell which is adjacent to the memory cell MCA via the interlayer insulating film 38 is referred to as a memory cell MCB. A memory cell which is adjacent to the memory cell MCB via the interlayer insulating film 38 and which is located on the opposite side of the memory cell MCB from the memory cell MCA in the Y direction is referred to as a memory cell MCC. A memory cell which is adjacent to the memory cell MCC via the interlayer insulating film 38 and which is located on the opposite side of the memory cell MCC from the memory cell MCB in the Y direction is referred to as a memory cell MCD. The components of the memory cell MCA are assigned symbols ending with "A". The components of the memory cell MCB are assigned symbols ending with "B". The components of the memory cell MCC are assigned symbols ending with "C". The components of the memory cell MCD are assigned symbols ending with "D". The word line WLB is an example of a "fourth interconnect", and the word line WLC is an example of a "fifth interconnect". The storage layer 30B is an example of a "second storage layer". A liner film 70 in contact with one side surface of the memory cell MCA is herein referred to as a liner film 70c. A liner film lying between the memory cell MCA and the memory cell MCB is referred to as a liner film 70d. A liner film lying between the memory cell MCB and the memory cell MCC is referred to as a liner film 70e. A liner film lying between the memory cell MCC and the memory cell MCD is referred to as a liner film 70f. A liner film in contact with the memory cell MCD and lying on the opposite side of the memory cell MCD from the liner film 70f in the Y direction is referred to as a liner film 70g. The liner film 70e is an example of a "second insulating film".

The semiconductor memory device according to the fourth embodiment has an interconnect pattern A with a narrow distance between word lines WL (interconnects) and an interconnect pattern B with a wide distance between interconnects. In the pattern A, the distance d1 between word lines WL (interconnects) is, for example, not more than 30 nm. In the pattern B, the distance d2 between word lines WL (interconnects) is, for example, more than 30 nm.

In the interconnect pattern B, the atomic ratio (N/O) between N and O in the liner film 70e at the first position G1 is not less than 1.0.

In the interconnect pattern B, the atomic ratio (N/O) between N and O in the liner film 70e at the second position G2 is not less than 1.0.

In the interconnect pattern B, the atomic ratio (N/O) between N and O is not less than 1.0 in the liner film 70e lying between word lines WL in the Y direction (first direction). The phrase "between word lines WL in the Y direction" refers to the range from a position D1, which is the position of one surface (WLBa in FIG. 22) of a particular word line WL (WLB in FIG. 22) in the Y direction, to a position D2 which is the position of the opposite surface (WLCa in FIG. 22) of a word line WL (WLC in FIG. 22) which is adjacent to the particular word line WL in the Y direction.

The distribution of the atomic ratio between Si, N, and O in the liner film 70d in the interconnect pattern A is, for example, the same as that in the liner film 70 of the first embodiment.

A method for manufacturing the semiconductor memory device of the fourth embodiment will now be described. The memory cells MC3 of the semiconductor memory device of the fourth embodiment can be manufactured by the same steps as those of the method for manufacturing the semiconductor memory device 1 except for the groove formation step and the nitriding step.

Two types of interconnect patterns as in the semiconductor memory device of the fourth embodiment can be formed by forming narrow grooves Gr and wide grooves Gr in the groove formation step.

In the nitriding step of the method for manufacturing the semiconductor memory device according to the fourth embodiment, the SiO film 75 is partly nitrided by, for example, plasma nitriding. The liner film lying between word lines WL in the Y direction in the interconnect pattern B with a wide inter-interconnect distance can be nitrided by adjusting the pressure, biasing conditions, and the processing time in the nitriding step.

Effects of the above-described semiconductor memory device of the fourth embodiment will now be described. According to the semiconductor memory device of the fourth embodiment, in the area of the interconnect pattern A with a narrow distance between interconnects, for which pressure resistance is required, both the protection of the storage layer 30 and good pressure resistance can be achieved. The liner film 70e is entirely nitrided in the area of the interconnect pattern B with a wide distance between interconnects, for which pressure resistance is little required. Therefore, oxidation of the interconnects can be prevented, and the stability can be enhanced.

While the semiconductor memory device of the fourth embodiment has been described with reference to the case where the second interconnects have two patterns with different distances between interconnects, it is possible to use the same construction for the first interconnects. In that case, the second interconnects (word lines) WL are replaced with the first interconnects (bit lines) BL, and the first direction (Y direction) is replaced with the second direction (X direction) in the above-described construction according to the fourth embodiment.

In the semiconductor memory device of the fourth embodiment, the liner film 70d in the interconnect pattern A has the same compositional distribution as that of the first embodiment. However, it is possible to employ the compositional distribution of the second or third embodiment instead.

According to at least one of the above-described embodiments, a semiconductor memory device has a first interconnect, a second interconnect, a first storage layer, and a first insulating film. The first interconnect extends in the first direction. The second interconnect extends in the second direction intersecting the first direction, and is provided at a different position from the first interconnect in the third direction intersecting the first direction and the second direction. The first storage layer is provided between the first interconnect and the second interconnect in the third direction. The first insulating film is provided along the surface of a part of the second interconnect and the surface of the first storage layer. The first insulating film is composed of Si, N, and O. The atomic ratio (N/O) between N and O in the first insulating film is not less than 1.0 at a first position which is the position of the second interconnect-side end surface of the first storage layer in the third direction. The atomic ratio (N/O) between N and O in the first insulating film is less than 1.0 at a second position which is the position of the end surface of the second interconnect, opposite to the first storage layer-side end surface, in the third direction. The semiconductor memory device having such a construction can have enhanced electrical properties.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

For example, the semiconductor memory device according to the present disclosure can be used as a semiconductor memory device having stacked memory cells other than PCMs, such as MRAMs (Magnetoresistive Random Access Memories), ReRAMs (Resistive Random Access Memories), and FeRAMs (Ferroelectric Random Access Memories).

What is claimed is:

1. A semiconductor memory device comprising:
   a first interconnect extending in a first direction;
   a second interconnect extending in a second direction intersecting the first direction, the second interconnect disposed at a different position from the first interconnect in a third direction intersecting the first direction and the second direction;
   a first storage layer disposed between the first interconnect and the second interconnect in the third direction; and
   a first insulating film disposed on at least a part of the second interconnect and the first storage layer,
   wherein the first insulating film includes Si, N, and O,
   wherein the atomic ratio (N/O) between N and O in the first insulating film is not less than 1.0 at a first position, the first position being the position of the second interconnect-side end surface of the first storage layer in the third direction, and
   wherein the atomic ratio (N/O) between N and O in the first insulating film is less than 1.0 at a second position, the second position being the position of the end surface of the second interconnect, opposite to the first storage layer-side end surface, in the third direction.

2. The semiconductor memory device according to claim 1, wherein the atomic ratio (N/O) between N and O in the first insulating film is not less than 1.0 in the range from the first position to a third position, the third position being the position of the first interconnect-side end surface of the first storage layer, in the third direction.

3. The semiconductor memory device according to claim 1, wherein the atomic ratio (N/O) between N and O in the first insulating film at the first position is not less than 7/3.

4. The semiconductor memory device according to claim 1, wherein the atomic ratio (N/O) between N and O in the first insulating film is less than 1.0 in the range from the second position to a fourth position in the third direction, the fourth position disposed from the second position toward the first interconnect in the third direction by a first distance, the first distance being equal to the minimum thickness of the first insulating film in the first direction.

5. The semiconductor memory device according to claim 1, further comprising a selector layer disposed (i) between the first interconnect and the first storage layer in the third direction, or (ii) between the first storage layer and the second interconnect in the third direction,
   wherein the atomic ratio (N/O) between N and O in the first insulating film is not less than 1.0 at a fifth position, the fifth position being the position of the second interconnect-side end surface of the selector layer in the third direction.

6. The semiconductor memory device according to claim 1, further comprising a third interconnect and a third storage layer, the third interconnect disposed at a different position from the second interconnect in the first direction, and extending in the second direction, the third storage layer disposed between the first interconnect and the third interconnect in the third direction,
   wherein the first insulating film is located between the second interconnect and the third interconnect in the first direction.

7. The semiconductor memory device according to claim 1, wherein the atomic ratio (N/O) between N and O in the first insulating film is less than 1.0 in the range from (i) the position of the first storage layer-side end surface of the second interconnect to (ii) the second position in the third direction, and
   wherein the atomic ratio (N/O) between N and O in the first insulating film is not less than 1.0 in a region of the first insulating film which lies at least at a second distance from the surface of the second interconnect in the first direction, the second distance being equal to the minimum thickness of the first insulating film in the first direction.

8. The semiconductor memory device according to claim 1, comprising:
   a fourth interconnect disposed at a different position in the first direction than the second interconnect and the third interconnect, and extending in the second direction;
   a second storage layer disposed between the first interconnect and the fourth interconnect;
   a fifth interconnect disposed at a different position in the first direction than the second interconnect, the third interconnect, and the fourth interconnect, and extending in the second direction; and
   a second insulating film disposed between the fourth interconnect and the fifth interconnect in the first direction, and disposed along a surface of the fourth interconnect and a surface of the second storage layer, wherein the atomic ratio (N/O) between N and O in the second insulating film is not less than 1.0 at the first position, and wherein the atomic ratio (N/O) between N and O in the second insulating film is not less than 1.0 at the second position.

9. The semiconductor memory device according to claim 1, wherein the first interconnect includes a bit line.

10. The semiconductor memory device according to claim 9, wherein the second interconnect includes a word line.

11. The semiconductor memory device according to claim 1, wherein the semiconductor memory device includes a phase change memory.

12. The semiconductor memory device according to claim 1, wherein the first conductive layer is in contact with the first storage layer.

13. The semiconductor memory device according to claim 1, wherein the first conductive layer includes at least one of Si, CN, or a tungsten containing material.

14. The semiconductor memory device according to claim 1, wherein a thickness of the first conductive layer in the third direction is less than a thickness of the first storage layer in the third direction.

15. The semiconductor memory device according to claim 1, wherein the first storage layer includes a phase change material.

16. The semiconductor memory device according to claim 1, wherein the atomic ratio (N/O) between N and O in the first insulating film at the first position is not less than 1.5.

17. A method for manufacturing a semiconductor memory device, comprising:

forming an interlayer insulating film on a silicon substrate;

forming an interconnect on the interlayer insulating film;

forming a storage layer on the interconnect;

forming a silicon oxide film including a first portion and a second portion, the first portion covers a side surface of apart of the interconnect, the second portion covers a side surface of the storage layer; and supplying nitrogen to the second portion of the silicon oxide film so that the second portion contains a larger amount of nitrogen than the first portion.

18. The method according to claim 17, wherein the atomic ratio (N/O) between N and O in the second portion is not less than 1.0.

19. The method according to claim 18, wherein the atomic ratio (N/O) between N and O in the second portion is not less than 7/3.

* * * * *